US012615974B2

(12) United States Patent
Hwang et al.

(10) Patent No.: US 12,615,974 B2
(45) Date of Patent: Apr. 28, 2026

(54) METHOD OF MANUFACTURING SEMICONDUCTOR DEVICE, SEMICONDUCTOR DEVICE, AND APPARATUS EMPLOYING THE SAME

(71) Applicant: SAMSUNG ELECTRONICS CO., LTD., Suwon-si (KR)

(72) Inventors: Kyungwook Hwang, Suwon-si (KR); Junsik Hwang, Suwon-si (KR); Dongho Kim, Suwon-si (KR); Joonyong Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 582 days.

(21) Appl. No.: 18/086,380

(22) Filed: Dec. 21, 2022

(65) Prior Publication Data

US 2023/0420251 A1      Dec. 28, 2023

(30) Foreign Application Priority Data

Jun. 22, 2022      (KR) ........................ 10-2022-0076381

(51) Int. Cl.
*H01L 21/02* (2006.01)
*C30B 25/04* (2006.01)
(Continued)

(52) U.S. Cl.
CPC ........ *H01L 21/02639* (2013.01); *C30B 25/04* (2013.01); *C30B 25/18* (2013.01);
(Continued)

(58) Field of Classification Search
CPC ........... H01L 21/02639; H01L 21/0254; H01L 21/02568; C30B 25/04; C30B 29/406;
(Continued)

(56) References Cited

U.S. PATENT DOCUMENTS 9,240,145 B2 1/2016 Ichioka et al.
10,115,862 B2 10/2018 Zhan et al.
(Continued)

FOREIGN PATENT DOCUMENTS

KR      10-1228992 B1      2/2013
KR      10-2013-0022088 A      3/2013
(Continued)

OTHER PUBLICATIONS

Gunho et al., "Large-scale patterned multi-layer graphene films as transparent conducting electrodes for GaN light-emitting diodes," Nanotechnology 21 (2010) 175201 (Year: 2010).*
(Continued)

*Primary Examiner* — Julia Slutsker
(74) *Attorney, Agent, or Firm* — Sughrue Mion, PLLC

(57) ABSTRACT

A method of manufacturing a semiconductor device, including: forming a membrane forming pattern on a substrate; forming a membrane material layer on the substrate, wherein the membrane material layer covers the membrane forming pattern; forming a membrane having a protruding pattern by crystallizing the membrane material layer; forming a two-dimensional (2D) material pattern on the protruding pattern by growing a 2D material on the membrane; and transferring the 2D material pattern to a transfer substrate.

15 Claims, 36 Drawing Sheets

(51) Int. Cl.

| | | |
|---|---|---|
| *C30B 25/18* | (2006.01) |
| *H01L 25/075* | (2006.01) |
| *H10H 20/01* | (2025.01) |
| *H10H 20/825* | (2025.01) |

(52) U.S. Cl.
CPC .... *H01L 21/02403* (2013.01); *H01L 21/0262* (2013.01); *H01L 25/0753* (2013.01); *H10H 20/0133* (2025.01); *H10H 20/018* (2025.01); *H10H 20/825* (2025.01)

(58) Field of Classification Search
CPC . C30B 29/20; H10H 20/01335; H10H 20/014
See application file for complete search history.

(56) References Cited

U.S. PATENT DOCUMENTS

| | | | |
|---|---|---|---|
| 10,211,364 | B2 | 2/2019 | Schuele et al. |
| 10,243,097 | B2 | 3/2019 | Yuen |
| 10,418,527 | B2 | 9/2019 | Sasaki et al. |
| 10,930,819 | B2 | 2/2021 | Sasaki et al. |
| 2017/0271556 | A1 | 9/2017 | Yoon et al. |
| 2020/0152826 | A1 | 5/2020 | Lee et al. |
| 2021/0091257 | A1 | 3/2021 | Hwang et al. |
| 2021/0119079 | A1 | 4/2021 | Hwang et al. |
| 2021/0397045 | A1 | 12/2021 | Hwang et al. |
| 2022/0013400 | A1 | 1/2022 | Hwang et al. |
| 2022/0029046 | A1 | 1/2022 | Hong et al. |
| 2022/0102602 | A1 | 3/2022 | Hwang et al. |
| 2022/0173275 | A1 | 6/2022 | Hwang et al. |
| 2022/0189810 | A1 | 6/2022 | Hwang et al. |
| 2022/0416123 | A1* | 12/2022 | Hwang ................. H10H 20/84 |
| 2023/0064207 | A1 | 3/2023 | Hwang et al. |
| 2024/0421264 | A1* | 12/2024 | Lee ..................... H10D 86/441 |

FOREIGN PATENT DOCUMENTS

| | | | |
|---|---|---|---|
| KR | 10-2015-0043719 | A | 4/2015 |
| KR | 10-2018-0004551 | A | 1/2018 |
| KR | 10-1880078 | B1 | 7/2018 |
| KR | 10-2021-0064856 | A | 6/2021 |
| KR | 10-2022-0117114 | A | 8/2022 |

OTHER PUBLICATIONS

Machine Translation of KR 2013-0022088 (Year: 2013).*
Communication dated Apr. 1, 2024, issued by the Korean Intellectual Property Office in Korean Patent Application No. 10-2022-0076381.

* cited by examiner

METHOD OF MANUFACTURING SEMICONDUCTOR DEVICE, SEMICONDUCTOR DEVICE, AND APPARATUS EMPLOYING THE SAME

CROSS-REFERENCE TO RELATED APPLICATION

This application is based on and claims priority under 35 U.S.C. § 119 to Korean Patent Application No. 10-2022-0076381, filed on Jun. 22, 2022, in the Korean Intellectual Property Office, the disclosure of which is incorporated by reference herein in its entirety.

BACKGROUND

1. Field

The disclosure relates to a method of manufacturing semiconductor device, a semiconductor device, and an apparatus employing the same

2. Description of the Related Art

When a two-dimensional (2D) material is directly grown on a large-area substrate by applying a chemical vapor deposition (CVD) method, etc., the grown 2D material may have excellent characteristics such as crystallinity because the grown 2D material is grown at a high temperature. However, when the 2D material is grown on a general planar substrate, a grain boundary is formed at a boundary where domains of a small region in which the 2D material is grown meet, which may deteriorate characteristics of the 2D material over a certain reference area. In addition, when a pattern process is performed in a desired device shape on the 2D material grown on a large area, characteristics may deteriorate during transfer and pattern processes.

SUMMARY

Provided is a method of manufacturing a semiconductor device capable of maintaining characteristics during a growth process of a two-dimensional (2D) material and using the grown 2D material as a transfer template.

Provided are a semiconductor device manufactured by applying a method of manufacturing a semiconductor device and an apparatus including the semiconductor device.

Additional aspects will be set forth in part in the description which follows and, in part, will be apparent from the description, or may be learned by practice of the presented embodiments of the disclosure.

In accordance with an aspect of the disclosure, a method of manufacturing a semiconductor device includes forming a membrane forming pattern on a substrate; forming a membrane material layer on the substrate, wherein the membrane material layer covers the membrane forming pattern; forming a membrane having a protruding pattern by crystallizing the membrane material layer; forming a two-dimensional (2D) material pattern on the protruding pattern by growing a 2D material on the membrane; and transferring the 2D material pattern to a transfer substrate.

At least one from among a detector, a transistor, a diode, and a photoelectric device is manufactured by repeating the forming of the 2D material pattern and the transferring of the 2D material pattern to the transfer substrate a plurality of times.

A width of the protruding pattern of the membrane may be less than or equal to a grain size which is formed when the 2D material is grown.

The membrane forming pattern may include a sacrificial layer pattern, and the method may further include removing the sacrificial layer pattern.

The 2D material may include any one of graphene, hexagonal boron nitride (h-BN), and molybdenum disulfide ($MoS_2$).

The substrate may include a sapphire substrate, and the membrane may include crystallized alumina.

In accordance with an aspect of the disclosure, a method of manufacturing a semiconductor device includes forming a membrane forming pattern on a substrate; forming a membrane material layer on the substrate, wherein the membrane material layer covers the membrane forming pattern; forming a membrane having a protruding pattern by crystallizing the membrane material layer; forming a two-dimensional (2D) material pattern on the protruding pattern by growing a 2D material on the membrane; growing a semiconductor material on the 2D material pattern and forming a semiconductor device structure; and separating the semiconductor device structure from the substrate.

The separating may include separating the semiconductor device structure from the 2D material pattern.

The separating may include separating the 2D material pattern from the protruding pattern such that the semiconductor device structure and the 2D material pattern are separated from the substrate.

Leg parts of the membrane may collapse during the separating such that the semiconductor device structure is separated from the substrate.

transferring the separated semiconductor device structure onto a transfer substrate.

The transferring may include transferring the semiconductor device structure onto the transfer substrate by a fluid self-assembly method.

The semiconductor device structure may include a light emitting diode (LED) device.

A width of the protruding pattern of the membrane may be less than or equal to a grain size which is formed when the 2D material is grown.

The membrane forming pattern may include a sacrificial layer pattern, and the method may further include removing the sacrificial layer pattern.

The 2D material may include any one of graphene, hexagonal boron nitride (h-BN), and molybdenum disulfide ($MoS_2$).

The substrate may include a sapphire substrate, and the membrane may include crystallized alumina.

In accordance with an aspect of the disclosure, a semiconductor device includes a semiconductor device structure including a first surface on a first side and a second surface on a second side, wherein the second side is opposite the first side, wherein the first surface has a first area, and wherein the second surface has a second area which is smaller than the first area; and a plurality of first and second regions having different defect densities on the first surface.

The semiconductor device may include a light emitting diode (LED) device, and wherein the LED device may include: a light emission layer including a first semiconductor layer, an active layer disposed on the first semiconductor layer, and a second semiconductor layer disposed on the active layer, wherein the first semiconductor layer may include the first surface; and an electrode layer on the second semiconductor layer.

The semiconductor device may further include a two-dimensional (2D) material pattern disposed on the first surface.

In accordance with an aspect of the disclosure, a display device includes a pixel array including unit pixels arranged in a two-dimensional (2D) array, wherein each of the unit pixels may include three or more pixels configured to emit a plurality of different color lights, wherein each of the three or more pixels may include a light emitting diode (LED) device, and wherein the LED device may include: a structure having a first surface on a first side and a second surface on a second side, wherein the second side is opposite the first side, wherein the first surface has a first area, and wherein the second surface has a second area which is smaller than the first area, and a plurality of first and second regions having different defect densities disposed on the first surface, and a light emission layer including a first semiconductor layer, an active layer on the first semiconductor layer, and a second semiconductor layer on the active layer, wherein the first semiconductor layer may include the first surface; and an electrode layer on the second semiconductor layer.

The LED device further may include a 2D material pattern disposed on the first surface.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
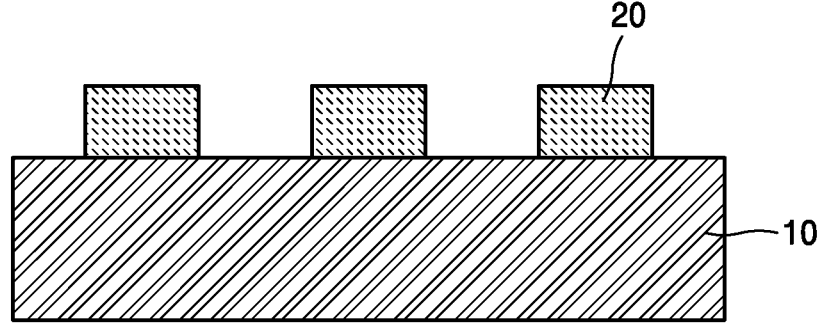
FIGS. 1A to 1F are diagrams illustrating a method of manufacturing a semiconductor device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described with reference to the accompanying drawings. In the drawings, like reference numerals refer to like elements, and the sizes of elements may be exaggerated for clarity of illustration. The embodiments described herein are for illustrative purposes only, and various modifications may be made therein.

In the following description, when an element is referred to as being "above" or "on" another element, it may be directly on an upper, lower, left, or right side of the other element while making contact with the other element or may be above an upper, lower, left, or right side of the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in an appropriate order unless explicitly described in terms of order or described to the contrary, and are not limited to the stated order thereof.

Also, terms such as "unit" or "module" used herein may be used to denote a unit that has at least one function or operation and is implemented with hardware, software, or a combination of hardware and software.

Furthermore, line connections or connection members between elements depicted in the drawings represent functional connections and/or physical or circuit connections by way of example, and in actual applications, they may be replaced or embodied with various additional functional connections, physical connections, or circuit connections.

All examples or exemplary terms are just used herein to describe technical ideas and should not be considered for purposes of limitation unless defined by the claims.

FIGS. 1A to 1F are diagrams illustrating a method of manufacturing a semiconductor device according to an embodiment.

Referring to FIG. 1A, a pattern 20 for forming a membrane is formed on a top surface of a substrate 10. The substrate 10 may include, for example, a sapphire substrate, a silicon (Si) substrate, a silicon carbide (SiC) substrate, a Gallium arsenide (GaAs) substrate, etc.

The membrane forming pattern 20 may be, for example, a sacrificial layer pattern 20. In FIG. 1A and the following drawings, for convenience, the membrane forming pattern and the sacrificial layer pattern are denoted by the same reference numeral. The sacrificial layer pattern 20 may be another expression of the membrane forming pattern 20. Also, when the membrane forming pattern 20 is removed, the membrane forming pattern 20 may correspond to the sacrificial layer pattern 20. Hereinafter, in an embodiment in which the membrane forming pattern 20 is removed during the process, the membrane forming pattern 20 is mainly referred to as the sacrificial layer pattern 20 for convenience.

The sacrificial layer pattern 20 may include, for example, photoresist, a resin for nanoimprinting, or organic nanoparticles. The sacrificial layer pattern 20 may be formed by, for example, a photolithography method, a nano-imprint method, an organic nanoparticle attachment method, etc. The sacrificial layer pattern 20 may be formed in various shapes as needed. The sacrificial layer pattern 20 may be formed in, for example, a rectangular bar pattern having a longer side extending in one direction. As another example, the sacrificial layer pattern 20 may be formed to have various cross-sectional shapes, such as a square, a polygon, a circle, an oval, an arbitrary shape, etc. The width, number, interval, and/or length of the sacrificial layer pattern 20 may be variously designed in consideration of the size of the semiconductor device to be manufactured. In addition, the width of the sacrificial layer pattern 20, and thus the width of a protruding pattern 30a of a membrane 30, an example of which described below, may be designed such that a two-dimensional (2D) material is grown on the protruding pattern 30a without including a grain boundary. For example, the width of the protruding pattern 30a of the membrane 30 may be designed to be less than or equal to a grain size of the 2D material grown on the membrane 30 in a process which is described below.

Figure 1B:
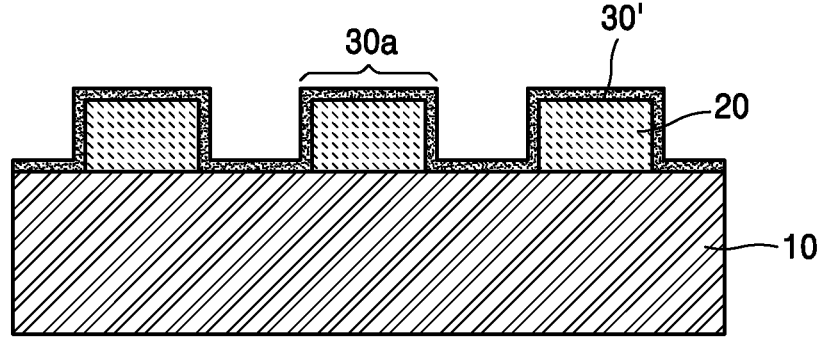
Figure 1C:
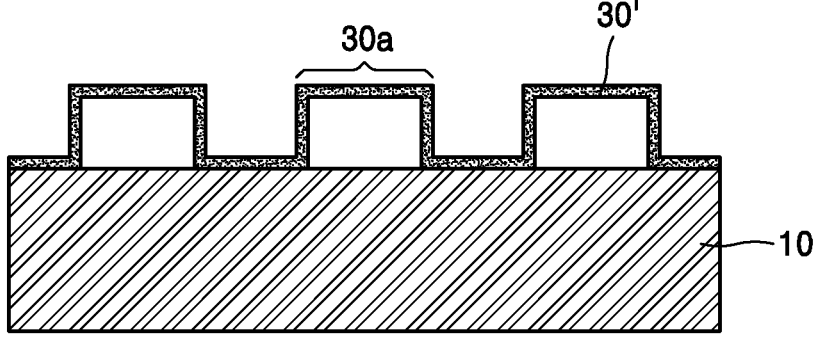

Referring to FIG. 1B, a membrane material layer 30' is formed on the top surface of the substrate 10 to cover the sacrificial layer pattern 20. The membrane material layer 30' may be formed at a temperature by which the sacrificial layer pattern is not deformed. The membrane material layer 30' may be formed to a thickness such that the shape of a structure may be stably maintained even after the sacrificial layer pattern 20 is removed. When the sacrificial layer pattern 20 is removed in a subsequent process, a cavity may be formed between the substrate 10 and the protruding pattern 30a of the membrane material layer 30' corresponding to a portion covering the sacrificial layer pattern 20.

The membrane material layer 30' may be formed by various methods such as atomic layer deposition, wet synthesis, metal deposition and oxidation, sputtering, etc. The membrane material layer 30' may be formed in an amorphous form or a polycrystalline form of fine particles.

The membrane material layer 30' may include, for example, alumina ($Al_2O_3$), and may further include silica ($SiO_2$), titania ($TiO_2$), zirconia ($ZrO_2$), icria ($Y_2O_3$)-zirconia, copper oxide (CuO, $Cu_2O$), tantalum oxide ($Ta_2O_5$), aluminum nitride (AlN), silicon nitride ($Si_3N_4$), etc.

Figure 10:
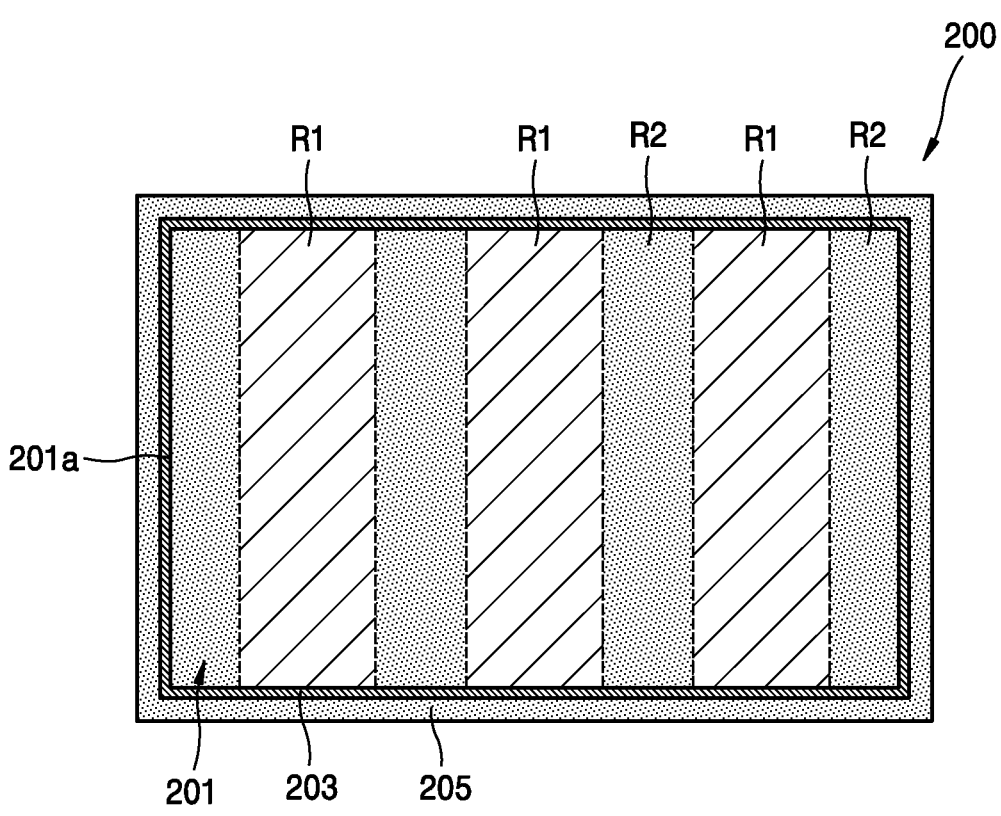
FIG. 10 is a schematic plan view of a semiconductor device structure manufactured by a manufacturing process of FIGS. 6A to 6D and separated by any one of separation methods of FIGS. 7 to 9, according to embodiments.

Referring to FIG. 10, the sacrificial layer pattern 20 may be selectively removed from the substrate 10. The sacrificial layer pattern 20 may be removed using, for example, heating, ashing, or an organic solvent. The space from which the sacrificial layer pattern 20 is removed may be formed as a cavity by the substrate 10 and the membrane material layer 30', and the membrane material layer 30' may have the protruding pattern 30a with respect to the substrate 10. Here, on both sides of the cavity, that is, on both sides of the protruding pattern 30a, leg parts of the membrane material layer 30' may be provided to contact the substrate 10.

Figure 1D:
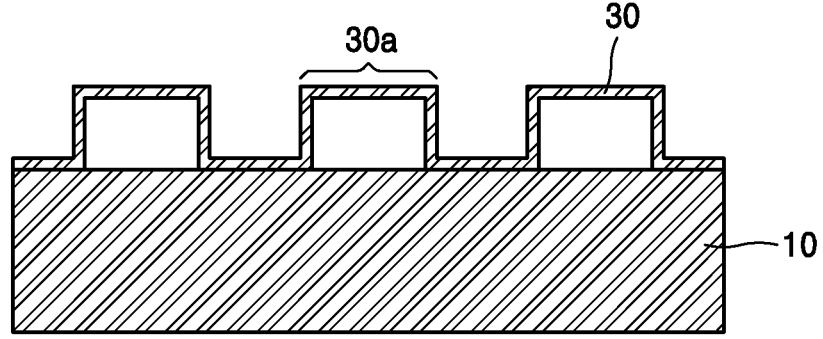

Referring to FIG. 1D, because the membrane material layer 30' formed by the previous process may be in an amorphous form or a polycrystalline form of very small particles, after the sacrificial layer pattern 20 is removed, the membrane material layer 30' may be crystallized through heat treatment to form the membrane 30. Accordingly, the crystallized membrane 30 having the protruding pattern 30a with respect to the substrate 10 may be formed. In embodiments, the width of the protruding pattern 30a of the membrane 30 may be less than or equal to the grain size of the 2D material grown on the membrane 30 as described above. In this case, the 2D material may be grown on the protruding pattern 30a of the membrane 30 without including the grain boundary. In embodiments, the width of the protruding pattern 30a of the membrane 30 is not limited to be less than or equal to the grain size of the 2D material, and may be larger than the grain size of the 2D material, but may be within the range in which characteristics of the grown 2D material such as crystallinity do not deteriorate.

When the substrate 10 and the membrane material layer 30' have the same composition, for example, when the substrate 10 includes the sapphire substrate and the membrane material layer 30' includes alumina, the crystallized membrane having the protruding pattern 30a may be formed by crystallizing the membrane material layer 30' into the same crystal structure as that of the substrate 10 through heat treatment at a high temperature, for example, about 1000° C. This is because crystallization occurs according to a crystal direction of the substrate 10 while solid phase epitaxy occurs in the leg part of the membrane material layer 30' that is in direct contact with the substrate 10 during high-temperature heat treatment. When the membrane material layer 30' includes alumina, the membrane 30 may include crystallized alumina.

The membrane 30 formed by the crystallization process may be formed in a polycrystalline form including large particles or a single crystal form. The protruding pattern 30a of the membrane 30 may be crystallized because the protruding pattern 30a serves as a seed layer when the 2D material and a nitride semiconductor epitaxial layer are grown in a subsequent process.

Figure 1E:
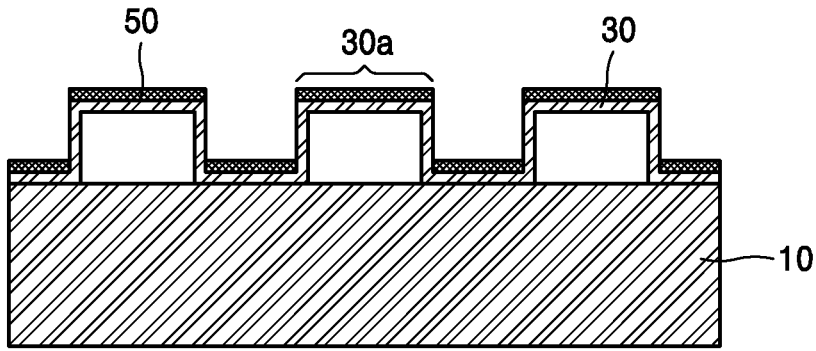

Referring to FIG. 1E, the 2D material may be grown on the membrane 30. The 2D material may be grown on a top surface of the protruding pattern 30a of the membrane 30 and a region between the protruding patterns 30a. The 2D material may be any one of, for example, graphene, hexagonal boron nitride (h-BN), and molybdenum disulfide ($MoS_2$).

Because the membrane 30 has the protruding pattern 30a, the 2D material grown on the top surface of the protruding pattern 30a of the membrane 30 corresponds to a 2D material pattern 50. In embodiments, when the width of the protruding pattern 30a of the membrane 30 is less than or equal to the grain size formed upon growing of the 2D material, the 2D material pattern 50 may be grown in a structure that does not include the grain boundary, and thus characteristics of the 2D material pattern 50 such as crystallinity may be excellent. In embodiments, excellent characteristics may refer to characteristics which are suitable for a particular purpose or otherwise desirable. Also, even when the width of the protruding pattern 30a of the membrane 30 is greater than the grain size of the 2D material, the width of the protruding pattern 30a of the membrane 30 may be within the range in which characteristics of the grown 2D material such as crystallinity do not deteriorate, and thus the characteristics of the 2D material grown on the protruding pattern 30a such as crystallinity may not deteriorate.

Accordingly, the 2D material grown on the crystallized membrane 30 may maintain characteristics of the membrane 30 during the growth process, and thus the 2D material pattern 50 having excellent characteristics such as crystallinity may be formed. In addition, the width of the protruding pattern 30a of the membrane 30 is within the range in which the characteristics of the grown 2D material such as crystallinity do not deteriorate, and thus, the characteristics of the 2D material during the growth process may be maintained. As described above, the width of the protruding pattern 30a of the membrane 30 is not limited to be less than or equal to the grain size of the 2D material. The width of the protruding pattern 30a of the membrane 30 may be less than or greater than the grain size of the 2D material, but may be within the range in which the characteristics of the grown 2D material such as crystallinity do not deteriorate.

The 2D material pattern 50 having excellent characteristics such as crystallinity may be formed, by growing the 2D material on the crystallized membrane 30 having the protruding pattern 30a as described above.

Figure 1F:
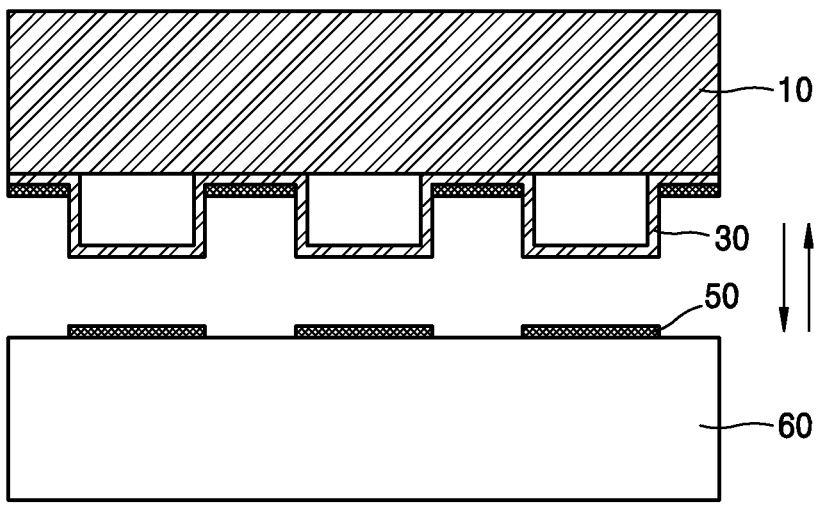
Figure 2A:
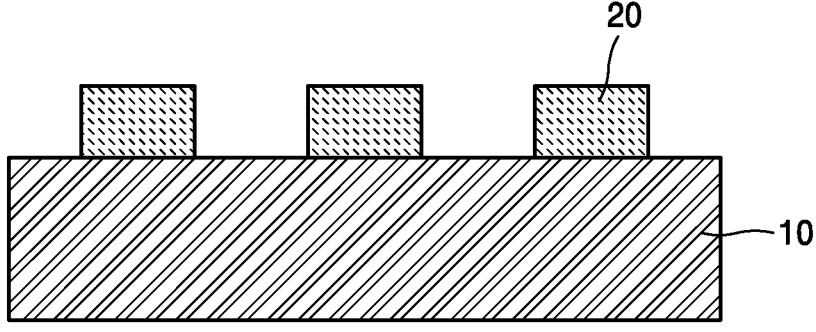
FIGS. 2A to 2E are diagrams illustrating a modified example of the embodiment of FIGS. 1A to 1F, according to embodiments.
Figure 2B:
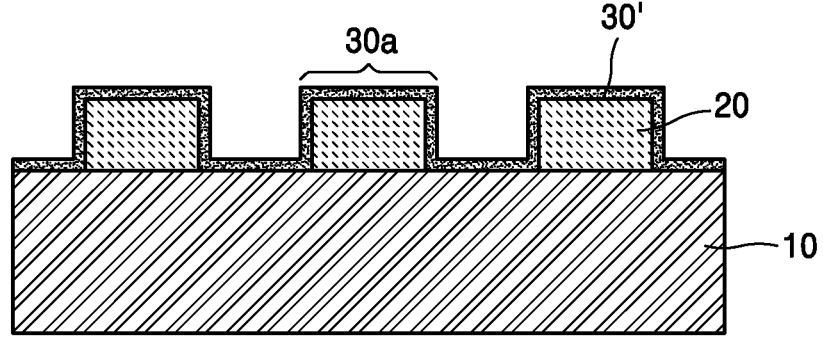
Figure 2C:
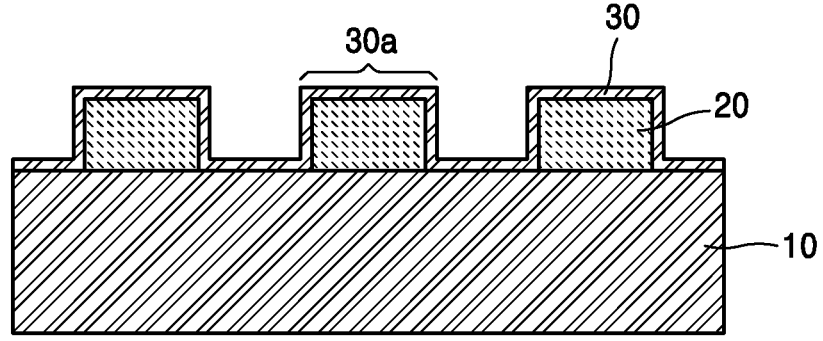
Figure 2D:
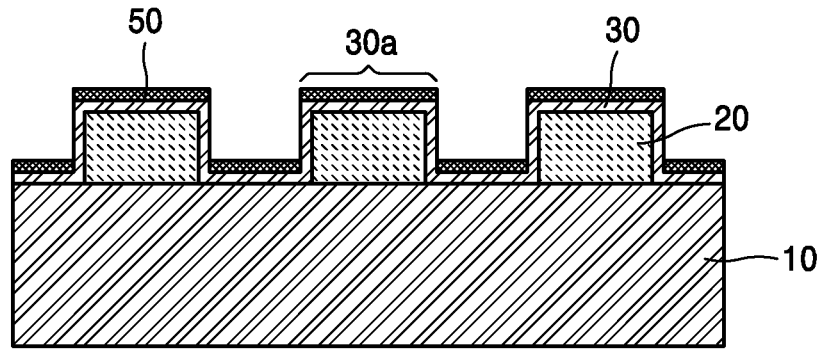
Figure 2E:
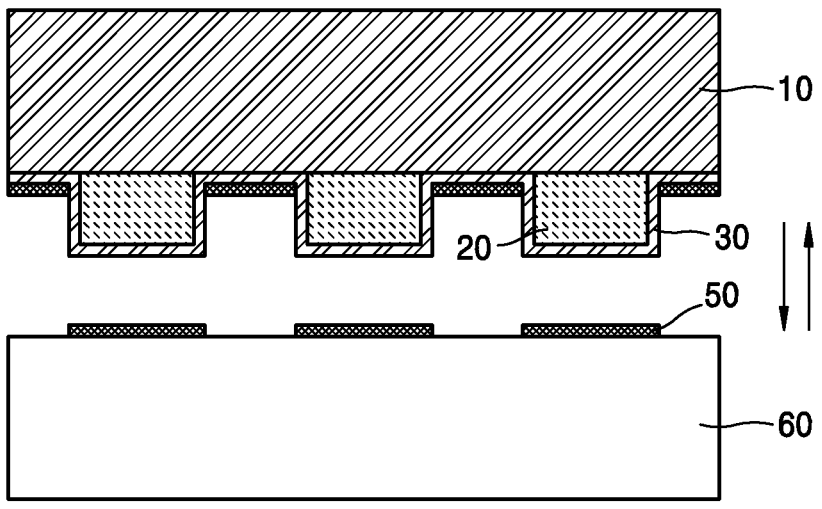

Referring to FIG. 1F, the 2D material pattern 50 on the protruding pattern 30a of the membrane 30 may be transferred to a transfer substrate 60 or used as a transfer template after a semiconductor layer growth process.

FIG. 1F shows an example of transferring the 2D material pattern 50 on the protruding pattern 30a of the membrane 30 to the transfer substrate 60. The 2D material pattern 50 on the protruding pattern 30a of the membrane 30 may be transferred onto the transfer substrate 60 as if stamping using the van der Weals force. Also, by collapsing the leg parts of the membrane 30, a stack structure of an upper end of the protruding pattern 30a and the 2D material pattern 50 may be transferred onto the transfer substrate 60. In embodiments, the stack structure may be transferred onto the transfer substrate 60 as if stamping using the van der Waals force. The upper end of the protruding pattern 30a of the membrane 30 may be removed using, for example, phosphoric acid ($H_3PO_4$), in a subsequent process.

The semiconductor device may be manufactured by performing a subsequent semiconductor process on the transfer substrate 60 onto which the 2D material pattern 50 is transferred. The 2D material pattern 50 may be used as an electrode of the manufactured semiconductor device.

As in another embodiment which is described below, a semiconductor device structure may be formed by performing a semiconductor growth process on the 2D material pattern 50 on the protruding pattern 30a of the membrane 30, and transferred onto a heterogeneous substrate. In embodiments, because the 2D material pattern 50 may make it possible to easily separate the semiconductor device structure from the substrate 10 due to a weak bonding force, the 2D material pattern 50 may be used as a transfer template for transferring the semiconductor device structure onto the heterogeneous substrate. In embodiments, the semiconductor device structure may be separated from the substrate 10 with or without the 2D material pattern 50.

According to the method of manufacturing the semiconductor device of the above embodiment, and various embodiments which are described below, because the 2D material pattern 50 may be formed by directly growing the 2D material on the structure of the crystallized membrane 30 having the protruding pattern 30a, without a physical process of patterning the 2D material grown on a large-area substrate on a desired device region, the physical patterning process of the 2D material may be omitted so that the grown 2D material pattern 50 may not be damaged, and the 2D material may be grown to have characteristics of the membrane 30.

FIGS. 2A to 2E are diagrams illustrating a modified example of the embodiment of FIGS. 1A to 1F, and are different from FIGS. 1A to 1F in that FIGS. 2A to 2E do not include a process of removing the sacrificial layer pattern 20 of FIG. 10. Processes of FIGS. 2A, 2B, 2C, 2D, and 2E correspond to the processes of FIGS. 1A, 1B, 1D, 1E, and 1F, respectively, except that the membrane forming pattern 20 is present in a region corresponding to the cavity in the protruding pattern 30a. For convenience of explanation, redundant description of FIGS. 2A to 2F may be omitted.

Referring to FIGS. 2A to 2E, the membrane forming pattern 20 may be formed on the substrate 10, the membrane material layer 30' may be formed to cover the membrane forming pattern 20, the membrane 30 material layer having the protruding pattern 30a may be formed by crystallizing the membrane material layer 30', a 2D material may be grown on the membrane 30, and the 2D material pattern 50 corresponding to the protruding pattern 30a may be formed, and then a subsequent process may be performed.

Figure 3:
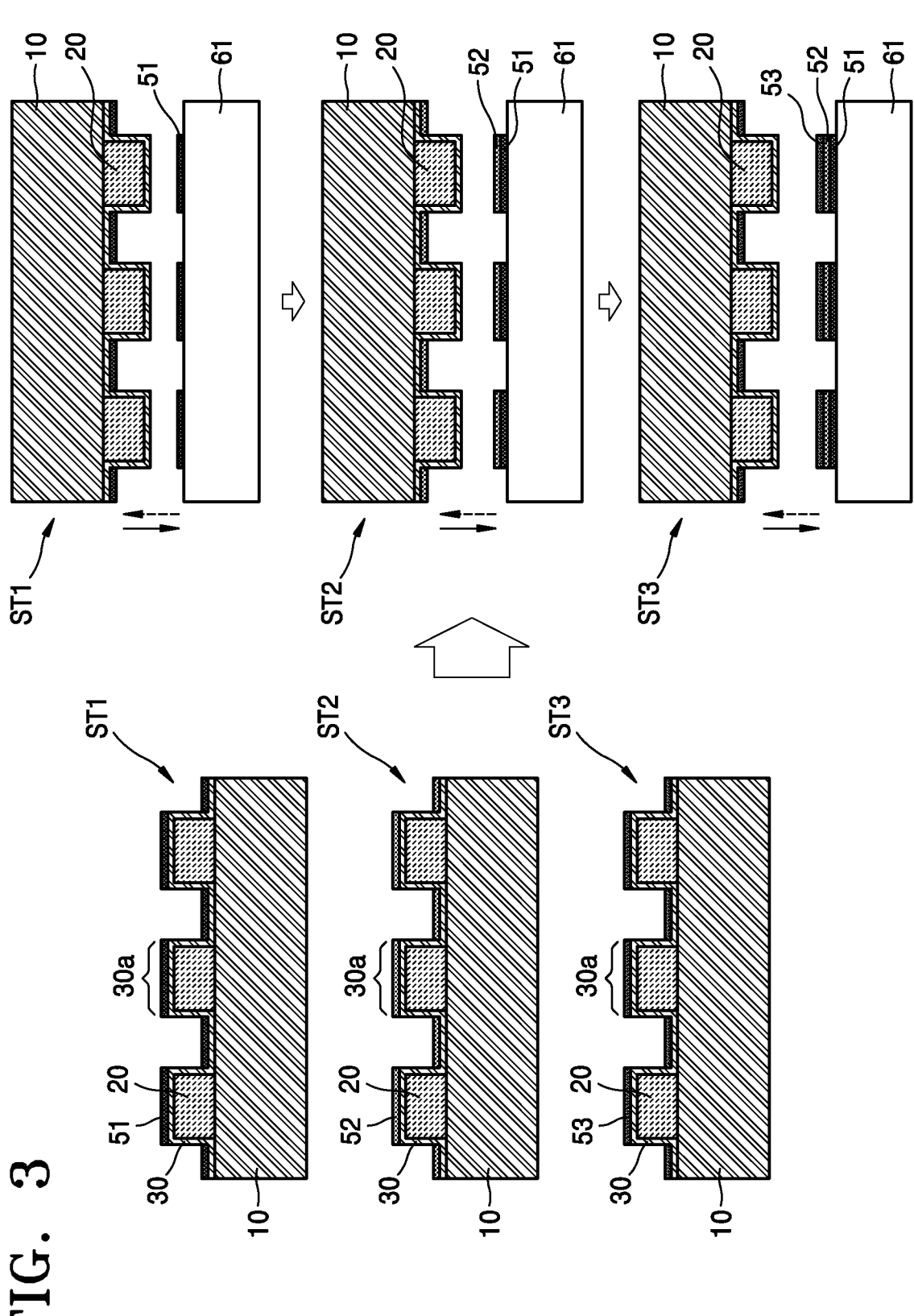
FIG. 3 is a diagram illustrating a method of manufacturing a semiconductor device according to another embodiment.

FIG. 3 is a diagram illustrating a method of manufacturing a semiconductor device according to another embodiment. FIG. 3 shows an example of forming a multi-stack structure of a 2D material pattern by multi-transferring 2D material patterns 51, 52, and 53 using a plurality of stamps, for example, first stamp ST1, second stamp ST2, and third stamp ST3.

In FIG. 3, each of the first to third stamps ST1, ST2, and ST3 may be formed through the manufacturing process described with reference to FIGS. 1A to 1E or the manufacturing process described with reference to FIGS. 2A to 2D. FIG. 3 shows an example in which the membrane forming pattern 20 is not removed. In embodiments, the membrane forming pattern 20 may be removed before the membrane material layer 30' is crystallized.

As shown on the left side of FIG. 3, the first 2D material pattern 51 may be formed on the protruding pattern 30a of the membrane 30 of the first stamp ST1, the second 2D material pattern 52 may be formed on the protruding pattern 30a of the membrane 30 of the second stamp ST2, and the third 2D material pattern 53 may be formed on the protruding pattern 30a of the membrane 30 of the third stamp ST3. As shown on the right side of FIG. 3, a stack structure in which the 2D material patterns 51, 52, and 53 are multi-transferred may be formed by sequentially performing process of transferring the first to third 2D material patterns 51, 52, and 53 of the first to third stamps ST1, ST2, and ST3 to a transfer substrate 61. Although FIG. 3 shows an example of forming a triple stack structure of the 2D material patterns 51, 52, and 53, embodiments are not limited thereto, and the number of stacked layers may vary depending on the number of repetitions of the process.

As described above, multi-stack transfer of a 2D material pattern is possible by using a plurality of stamps. When a plurality of stamps are prepared by growing a 2D material suitable for characteristics of a semiconductor device to be manufactured on the membrane 30 having the protruding pattern 30a provided on each substrate 10, are aligned on the transfer substrate 62 to design a device in a desired shape, and transferred by the van der Waals force, it is possible to manufacture a multi-junction device formed of the 2D material as shown for example in FIG. 3. For example, one of the first and third 2D material patterns 51 and 53 may be formed to have a p-type semiconductor characteristic and the other may be formed to have an n-type semiconductor characteristic, and the second 2D material pattern 52 may be formed to have an intrinsic semiconductor characteristic. In this case, the multi-junction device such as a detector, a transistor, or a photoelectric device may be implemented by using the stack structure of the first to third 2D material patterns 51, 52, and 53. In addition, the stack structure may be formed by sequentially transferring the first to third 2D material patterns 51, 52, and 53 of the first to third stamps ST1, ST2, and ST3 to the transfer substrate 61, and then a subsequent semiconductor process may be performed to manufacture the semiconductor device that uses the stack structure as an electrode.

Figure 4:
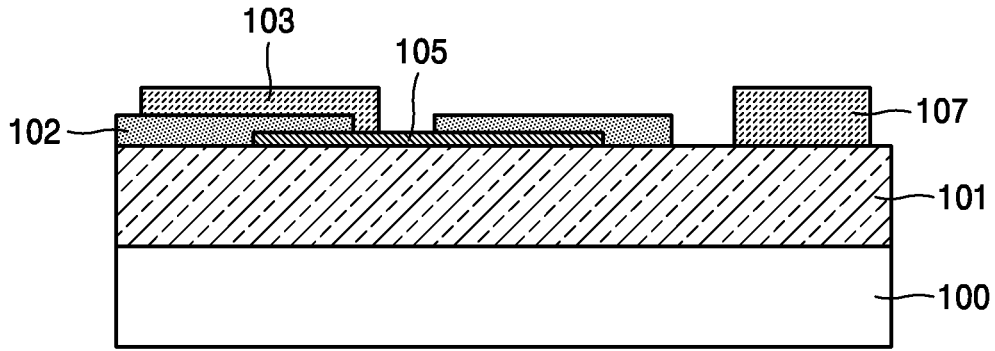
FIG. 4 is a diagram illustrating a semiconductor device according to an embodiment.

FIG. 4 is a diagram illustrating a semiconductor device according to an embodiment.

Referring to FIG. 4, a semiconductor layer 101 may be formed on the substrate 100, and a 2D material layer 105 may be formed on the semiconductor layer 101. A first electrode 107 may be formed to electrically contact the semiconductor layer 101, and a second electrode 103 may be formed to electrically contact the 2D material layer 105. An insulating layer 102 such as an oxide may be located between the second electrode 103 and the semiconductor layer 101.

The 2D material layer 105 may be formed by transferring the 2D material pattern 50 onto the semiconductor layer 101 using the van der Waals force through the manufacturing process described with reference to FIGS. 1A to 1F or the manufacturing process described with reference to FIGS. 2A to 2E.

One of the semiconductor layer 101 and the 2D material layer 105 may be provided as an n-type, and the other as a p-type. The 2D material layer 105 may be formed of a 2D material having an n-type or p-type conductivity, or may be formed to have an n-type or p-type conductivity through doping.

As shown in FIG. 4, the semiconductor device having a p-n junction structure may be manufactured, by transferring the 2D material pattern 50 onto the semiconductor layer 101 using the van der Waals force through the manufacturing process according to the embodiment.

FIGS. 5A to 5D show various p-n junction structures of a 2D material layer. The p-n junction structures of FIGS. 5A to 5D may be implemented as diodes, and may be further implemented as various electronic apparatuses or semiconductor devices requiring the p-n junction structure.

Figure 5A:
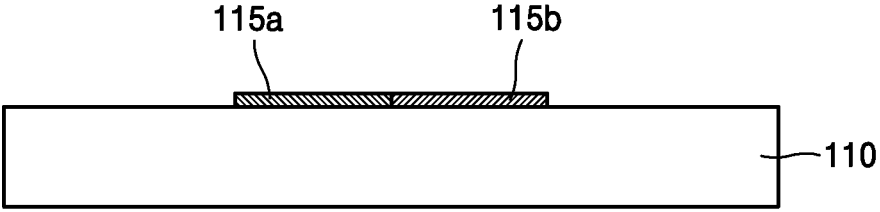
FIGS. 5A to 5D show various p-n junction structures of a two-dimensional (2D) material layer, according to embodiments.
Figure 5B:
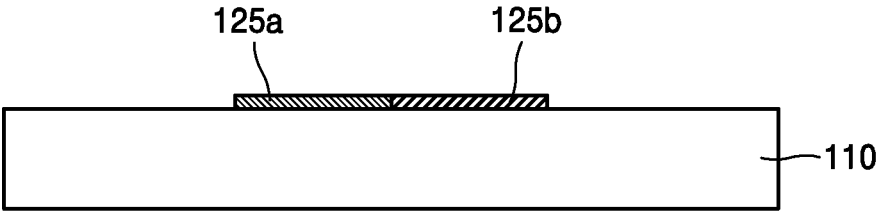
Figure 5C:
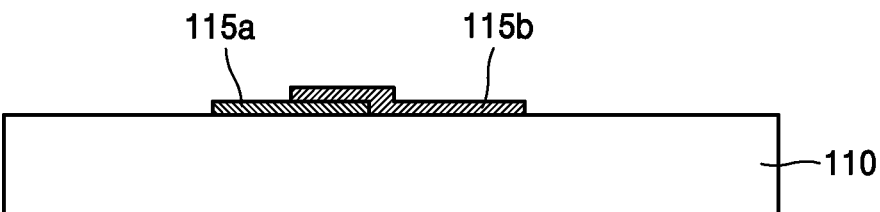
Figure 5D:
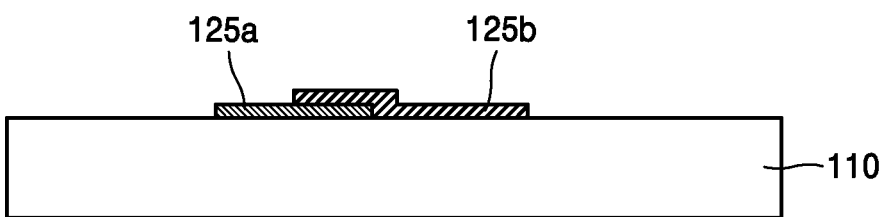

FIG. 5A shows an example in which a first 2D material layer 115a and a second 2D material layer 115b are formed on the substrate 110 in a planar junction structure. FIG. 5B shows an example in which a first 2D material layer 125a and a second 2D material layer 125b are formed on the substrate 110 in a planar junction structure. FIG. 5C shows an example in which the first 2D material layer 115a and the second 2D material layer 115b are formed on the substrate 110 in a junction structure in which partial regions are stacked. FIG. 5D shows an example in which the first 2D material layer 125a and the second 2D material layer 125b are formed on the substrate 110 in a junction structure in which partial regions are stacked.

Referring to FIGS. 5A and 5C, the first 2D material layer 115a and the second 2D material layer 115b may be formed of 2D materials having different conductivity types. Referring to FIGS. 5B and 5D, the first 2D material layer 125a and the second 2D material layer 125b may be formed of the same 2D material, and may have different doping concentrations to have different conductivity types.

The various junction structures of the first and second 2D material layers 115a and 115b, and the first and second 2D material layers 125a and 125b, as shown in FIGS. 5A to 5D, may be formed by transferring the 2D material pattern 50 twice to form a junction structure on the substrate 110 by the van der Waals force through the manufacturing process described with reference to FIGS. 1A to 1F or the manufacturing process described with reference to FIGS. 2A to 2E.

FIGS. 6A to 6D and 7 to 9 are diagrams illustrating a method of manufacturing a semiconductor device according to an embodiment. FIGS. 6A to 6D and 7 to 9 show the method of manufacturing the semiconductor device using the 2D material pattern 50 as a transfer template. Hereinafter, an example of manufacturing a semiconductor device structure 200, for example, a light emitting diode (LED) device structure, by applying the method of manufacturing the semiconductor device according to the embodiment is described.

Figure 6A:
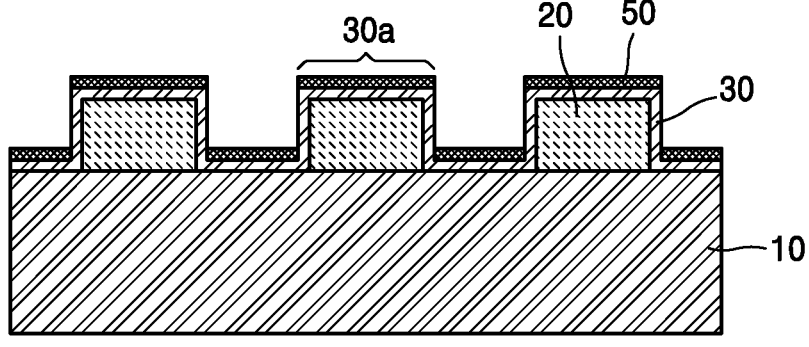
FIGS. 6A to 6D and 7 to 9 are diagrams illustrating a method of manufacturing a semiconductor device according to embodiments.

Referring to FIG. 6A, the 2D material pattern 50 may be formed on a top surface of the protruding pattern 30a of the membrane 30 by forming the crystallized membrane 30 having the protruding pattern 30a on the substrate 10 and growing a 2D material on the membrane 30. A structure of FIG. 6A may be formed through the manufacturing process described with reference to FIGS. 1A to 1E or the manufacturing process described with reference to FIGS. 2A to 2D. Here, the same elements, as those in FIGS. 1A to 1E and FIGS. 2A to 2D, or similar elements thereto, are denoted by the same reference numerals, and redundant descriptions thereof may be omitted. FIGS. 6A to 6D and 7 to 9 show an example in which the membrane forming pattern 20 is not removed. Before the membrane material layer 30' is crystallized, the membrane forming pattern 20, for example, the sacrificial layer pattern 20, may be removed.

Figure 6B:
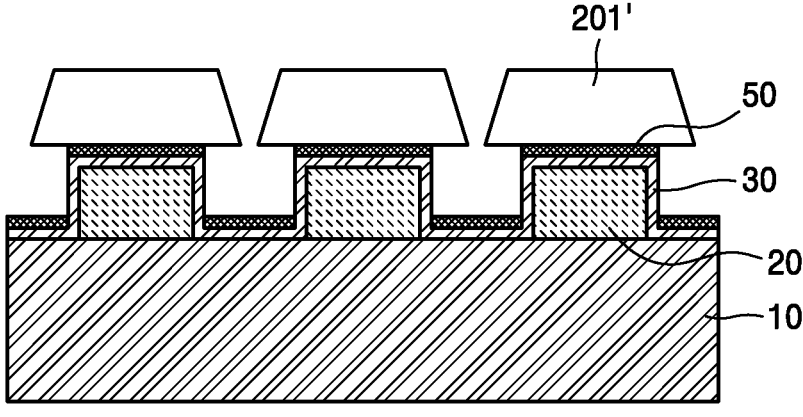

Referring to FIG. 6B, a semiconductor material may be grown on the 2D material pattern 50 of the protruding pattern 30a of the membrane 30. For example, a first semiconductor material 201' may be grown on the 2D material pattern 50 formed on the top surface of each protruding pattern 30a by chemical vapor deposition (CVD). The first semiconductor materials 201' may be grown in a shape in which an area of a lower surface in contact with the 2D material pattern 50 is greater than an area of a top surface, that is, a shape having a trapezoidal cross-section. The first semiconductor material 201' may be an n-type semiconductor or a p-type semiconductor. For convenience of description the n-type semiconductor is described below as an example. The first semiconductor material 201' may include a III-V group n-type semiconductor, for example, an n-type nitride semiconductor. The nitride semiconductor may include, for example, gallium nitride (GaN), indium nitride (InN), aluminum nitride (AlN), or a combination thereof. For example, the first semiconductor material 201' may include n-GaN.

Figure 6C:
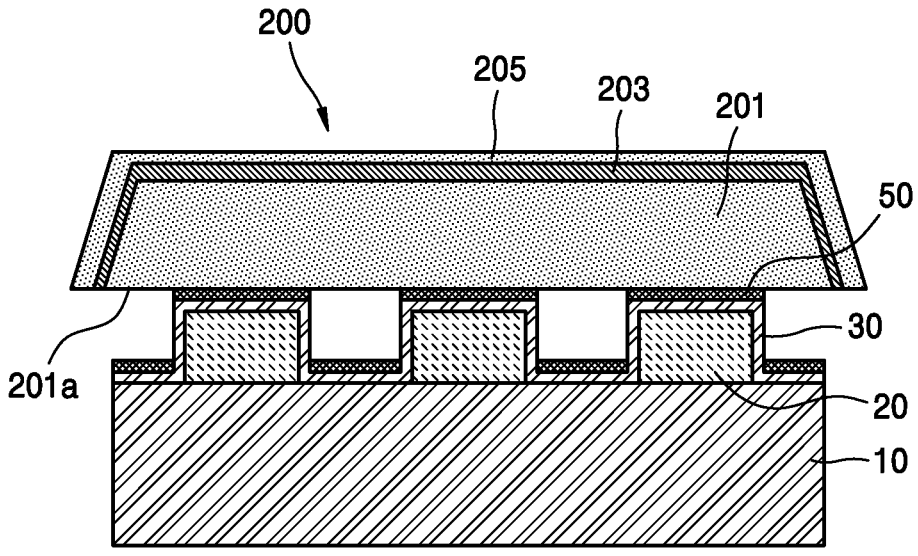

Referring to FIG. 6C, the first semiconductor materials 201' grown on the 2D material pattern 50 of each protruding pattern 30a of the membrane 30 may be combined into a single mass from the bottom. The first semiconductor materials 201' may be combined to obtain a first semiconductor layer 201. The first semiconductor layer 201 may be grown in a shape in which an area of the lower surface 201a (which may corresponding to a separation surface described below) in contact with the 2D material pattern 50 is greater than an area of a top surface, that is, a shape having a trapezoidal cross-section. The first semiconductor layer 201 may be an n-type semiconductor or a p-type semiconductor, and the n-type semiconductor is described as an example, hereinafter. The first semiconductor layer 201 may include a III-V group n-type semiconductor, for example, an n-type nitride semiconductor. The nitride semiconductor may include, for example, GaN, InN, AlN, or a combination thereof, and for example, the first semiconductor material 201' may include n-GaN. The first semiconductor layer 201 may have a single-layer or multi-layer structure.

An active layer 203 and a second semiconductor layer 205 may be grown on the first semiconductor layer 201. For example, the active layer 203 and the second semiconductor layer 205 may be grown by CVD. Each of the active layer 203 and the second semiconductor layer 205 may have a relatively thin thickness compared to the first semiconductor layer 201. The active layer 203 may be formed to cover the first semiconductor layer 201, and the second semiconductor layer 205 may be formed to cover the active layer 203. As another example, the active layer 203 may be formed only on a partial region of the first semiconductor layer 201, and the second semiconductor layer 205 may be formed on the active layer 203.

The active layer 203 may have a multi-quantum well (MQW) or single-quantum well (SQW) structure, and may generate light of a certain wavelength band while electrons and holes combine with each other. The active layer 203 may include a III-V group semiconductor, for example, a nitride semiconductor. For example, the active layer 203 may include GaN, InN, AlN, or a combination thereof.

The second semiconductor layer 205 may be a semiconductor layer doped in a different type from that of the first semiconductor layer 201, and may include, for example, a III-V group p-type semiconductor, for example, a p-type nitride semiconductor. For example, the second semiconductor layer 205 may include p-GaN. The second semiconductor layer 205 may have a single-layer or multi-layer structure.

The first semiconductor layer 201, the active layer 203, and the second semiconductor layer 205 may form an emission layer LEL.

Figure 6D:
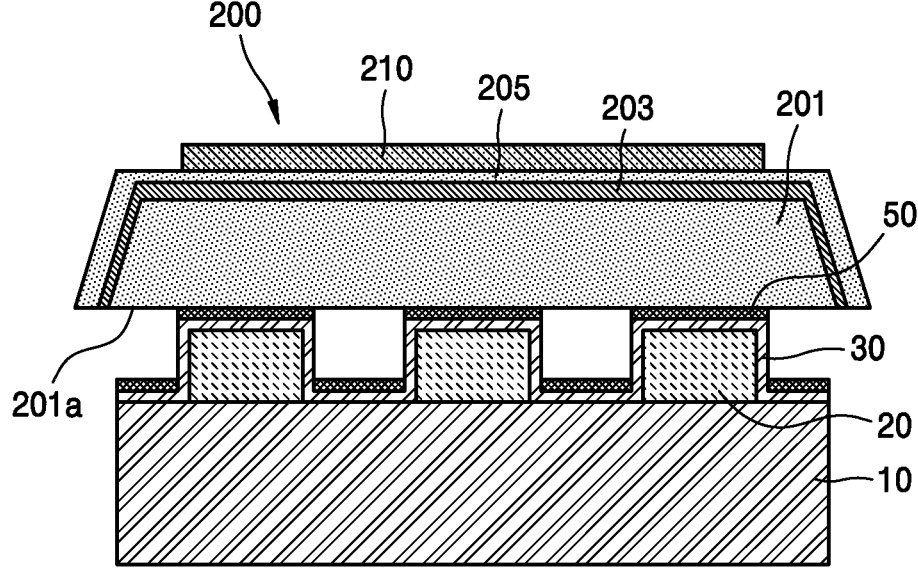

Referring to FIG. 6D, a first electrode 210 may be formed on the second semiconductor layer 205. The first electrode 210 may be formed by covering a region where the first electrode 210 is not formed with photoresist, and depositing metal materials having excellent conductivity using electron beam deposition, etc.

Through the process of FIGS. 6A to 6D, the semiconductor device structure 200, for example, an LED device structure may be grown on the 2D material pattern 50.

Figure 7:
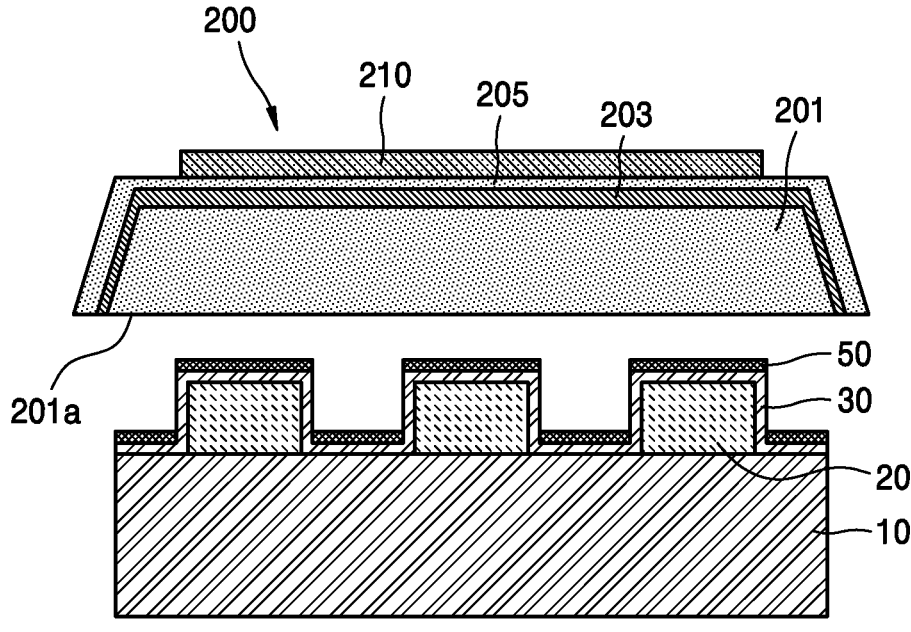
Figure 8:
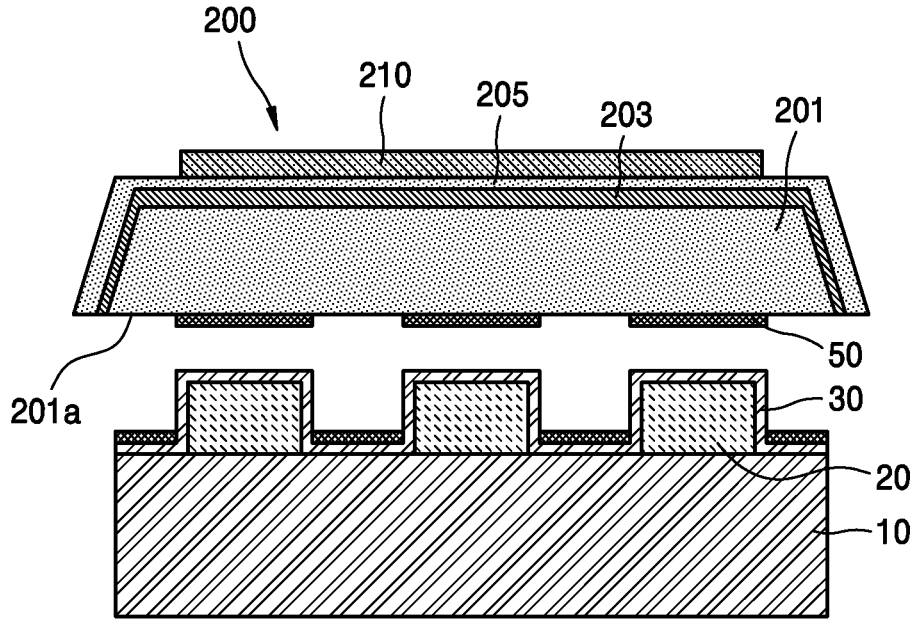
Figure 9:
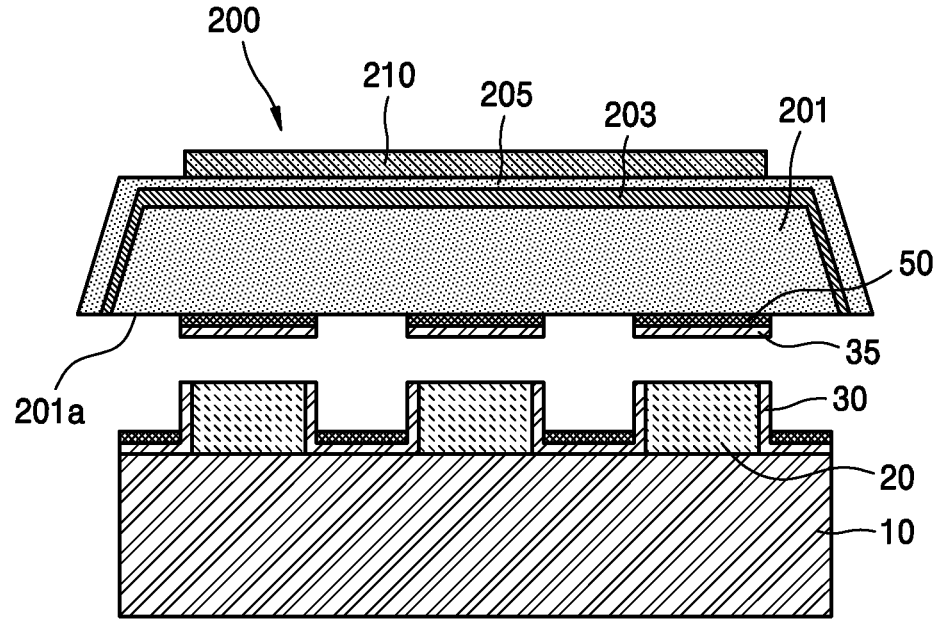

As shown for example in FIGS. 7 to 9, the semiconductor device structure 200 grown as described above may be separated from the membrane 30 with or without the 2D material pattern 50. When the semiconductor device structure 200 includes the 2D material pattern 50, it is possible to manufacture the semiconductor device, for example, an LED device, by using the 2D material pattern as an electrode.

FIG. 7 shows an example in which the semiconductor device structure 200 is separated from the membrane 30 without the 2D material pattern 50. Referring to FIG. 7, because the bonding force of the 2D material may be weak, the semiconductor device structure 200 may be separated from the 2D material pattern 50. In FIG. 7, reference numeral 201a denotes a separation surface.

FIG. 8 shows an example in which the semiconductor device structure 200 is separated from the membrane 30 with the 2D material pattern 50 on the separation surface, which may be for example lower surface 201a. Referring to FIG. 8, because the bonding force of the 2D material may be weak, the 2D material pattern 50 and the protruding pattern 30a of the membrane 30 may be separated from each other so that the semiconductor device structure 200 may be separated from the membrane 30 with the 2D material pattern 50 on the separation surface 201a.

FIG. 9 shows an example in which leg parts of the membrane 30 collapse so that the semiconductor device structure 200 is separated with a stack structure of an upper end part 35 of the protruding pattern 30a and the 2D material pattern 50 on the separation surface 201a. Referring to FIG. 9, when a force is applied so that the leg parts of the membrane 30 collapse, the semiconductor device structure 200 may be separated with a stack structure of an upper end part 35 of the protruding pattern 30a and the 2D material pattern 50 on the separation surface 201a. The upper end part 35 of the protruding pattern 30a of the membrane 30 may be removed in a subsequent process using phosphoric acid ($H_3PO_4$), etc.

When the LED device is manufactured using the method of manufacturing the semiconductor device according to the embodiment, a high-quality device having a small defect density may be manufactured because the membrane 30 and the 2D material pattern 50 are used. The membrane 30 may divide and distribute stress for generating dislocation with the light emission layer LEL, which may refer to the first semiconductor layer 201, the active layer 203, and the second semiconductor layer 205, grown thereon, and thus the light emission layer LEL grown on the 2D material pattern 50 may have high quality with low defect density.

In general, the stress caused by a physical difference between a growth substrate and a thin film grown thereon may be converted into elastic energy at the interface to become a driving force that generates dislocation. In general, because the growth substrate may be considerably thicker than the thin film, it may be difficult to deform and thus the stress may be relieved while dislocation is generated in the thin film. In embodiments, when the thin film grows to a certain thickness or more, dislocation starts to be generated as the elastic energy at the interface becomes greater than the generation energy of the dislocation. However, when the membrane 30 is thinner than the light emission layer LEL, the generation of dislocation in the light emission layer LEL may be reduced, and thus, the light emission layer LEL of high quality with low defect density may be formed.

As described above, the 2D material pattern 50 having relatively weak bonding force and physical characteristics of the membrane 30 may be formed on the protruding pattern 30a of the crystallized membrane 30, and the light emission layer LEL having excellent physical properties may be formed on the 2D material pattern 50, and thus, the high-quality LED device capable of having high efficiency and high reliability and increasing light extraction efficiency may be implemented. Here, an example of manufacturing the LED device by the method of manufacturing the semiconductor device according to the embodiment has been described, but the embodiment is not limited thereto, and the method of manufacturing the semiconductor device according to the embodiment may be applied in the same, similar or modified manner to manufacturing semiconductor devices of various shapes and materials.

FIG. 10 is a schematic plan view of the semiconductor device structure 200 manufactured by the manufacturing process of FIGS. 6A to 6D and separated by any one of the separation methods of FIGS. 7 to 9. FIG. 10 schematically shows the separation surface 201a of the semiconductor device structure 200. In FIG. 10, R1 of the separation surface 201a indicates a region corresponding to the protruding pattern of the membrane 30 and the 2D material pattern 50, and R2 of the separation surface 201a indicates a region between the protruding patterns 30a of the membrane 30. FIG. 10 shows an example in which the membrane forming pattern 20 and the protruding pattern 30a of the membrane 30 corresponding thereto are formed in a rectangular bar pattern having a longer side extending in one direction, but the embodiment is not limited thereto as described above, and may be formed to have a cross-sectional shape of various types, such as a rectangle, a polygon, a circle, an oval, an arbitrary shape, etc.

The separation surface 201a of the semiconductor device structure 200 manufactured by the manufacturing method according to the embodiment may include a plurality of R1 regions and a plurality of R2 regions. With regard to a defect density on the separation surface 201a of the semiconductor device structure 200, the defect density of the R1 region corresponding to the protruding pattern 30a of the membrane 30 and the 2D material pattern 50 may be different from the defect density of the R2 region that is the other region For example, the defect density of the R1 region may be greater than the defect density of the R2 region, however embodiments are not limited thereto.

Accordingly, it may be confirmed from a defect density distribution of the separation surface 201a of the semiconductor device structure 200 that the semiconductor device structure 200 is manufactured using the crystallized membrane 30 having the protruding pattern 30a.

In addition, because the semiconductor device structure 200 manufactured by the manufacturing method according to the embodiment may be separated from the membrane 30 by the 2D material pattern 50 having a weak bonding force, the separation surface 201a may sustain a relatively small amount of damage during a separation process, compared with other manufacturing methods. In addition, even when the semiconductor device structure 200 manufactured by the manufacturing method according to the embodiment has the 2D material pattern 50 on the separation surface 201a, because a physical patterning process for forming the 2D material pattern 50 is not applied, the separation surface 201a may sustain a relatively small amount of damage. Accordingly, it may be confirmed that the semiconductor device structure 200 is grown after the 2D material pattern 50 is grown on the protruding pattern 30a of the membrane 30 from a degree of damage of the separation surface 201a of the semiconductor device structure 200, for example, the LED device structure.

FIGS. 11A to 11E are diagrams illustrating a method of manufacturing a display device 1000 according to an embodiment. FIGS. 11A to 11E show an example of manufacturing the display device 1000 by using, as a micro LED device, the semiconductor device structure 200 manufactured by the method of manufacturing the semiconductor device described with reference to FIGS. 6A to 6D and separated from the membrane 30 as shown in FIGS. 7 to 9. For convenience of description, the semiconductor device structure 200 may be referred to herein as an LED device 200. However, embodiments are not limited thereto, and in embodiments the LED device 200 may be used interchangeably with any semiconductor device structure.

Figure 11A:
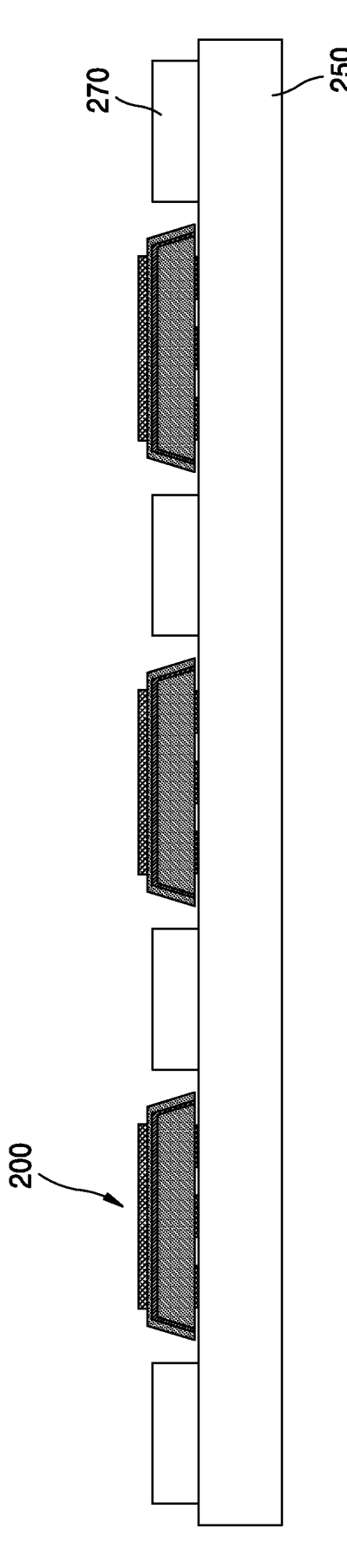
FIGS. 11A to 11E are diagrams illustrating a method of manufacturing a display device according to an embodiment.

Referring to FIG. 11A, the semiconductor device structure 200, which may be referred to for example as the LED device 200, may be manufactured by the manufacturing method described with reference to FIGS. 6A to 6D, and separated from the membrane 30 as in FIG. 8. FIGS. 11A to 11D show an example in which the separated LED device 200 with the 2D material pattern 50 on the separation surface

201a, that is, a surface of the first semiconductor layer 201, is applied. Here, as shown in FIG. 7, the LED device 200 without the 2D material pattern 50 separated from the membrane 30 may be applied, or, as shown in FIG. 9, leg parts of the membrane 30 collapse so that the LED device 200 which includes a stack structure of the upper end part 35 of the protruding pattern 30a and the 2D material pattern 50 and is separated from the membrane 30 may be applied. The upper end part 35 of the protruding pattern 30a of the membrane 30 may be removed in a subsequent process using phosphoric acid (H₃PO₄), etc.

The LED devices 200 may be transferred to the transfer substrate 250 including seating grooves between the protruding patterns 270 by a fluid self-assembly method. In order to transfer the LED device 200, for example, in a state in which the LED device 200 is dispersed in a fluid to make a suspension, the suspension may be applied to the transfer substrate 250, and the LED device 200 may be transferred to the transfer substrate 250 by a self-assembly method. In embodiments, any kind of liquid which does not corrode or damage the LED device 200 may be used as the fluid. The fluid may include, for example, one or a combination of a plurality of groups including water, ethanol, alcohol, polyol, ketone, halocarbon, acetone, flux, and organic solvent. The organic solvent may include, for example, isopropyl alcohol (IPA). An available fluid is not limited thereto, and various modifications are possible.

A method of supplying the suspension in which the LED device 200 is dispersed to the transfer substrate 250 may use, for example, a spray method, a dispensing method, an inkjet dot method, a method of flowing the suspension onto the transfer substrate 250, etc. A supplied amount of the suspension may be variously adjusted to fit or overflow the seating grooves.

As described above, after the LED device 200 is transferred to the transfer substrate 250 by the self-assembly method, the fluid may be removed by scanning the transfer substrate 250 with an absorber, etc. The absorber is sufficient as long as the absorber absorbs a fluid, and the shape or structure thereof is not limited. The absorber may include, for example, fabric, tissue, polyester fiber, paper or wipers, etc. The absorber may be used alone without other auxiliary tools, but is not limited thereto, and may be combined with a support for conveniently scanning the transfer substrate 250. The support may have various shapes and structures suitable for scanning the transfer substrate 250. The support may have the form of, for example, a rod, a blade, a plate, or a wiper. The absorber may be provided on either side of the support, or may surround the support. The absorber may scan the transfer substrate 250 while pressing the transfer substrate 250 at an appropriate pressure. Scanning may be performed by moving the transfer substrate 250 instead of moving the absorber. Also, scanning may be performed by cooperation of the absorber and the transfer substrate 250.

As described above, a structure in which the LED device 200 is disposed in the seating groove of the transfer substrate 250 may be obtained, by supplying the LED device 200 in a suspension state on the transfer substrate 250 and removing the fluid through the absorber, etc. In embodiments, the LED device 200 may be disposed such that the first electrode 210 faces upward.

Figure 11B:
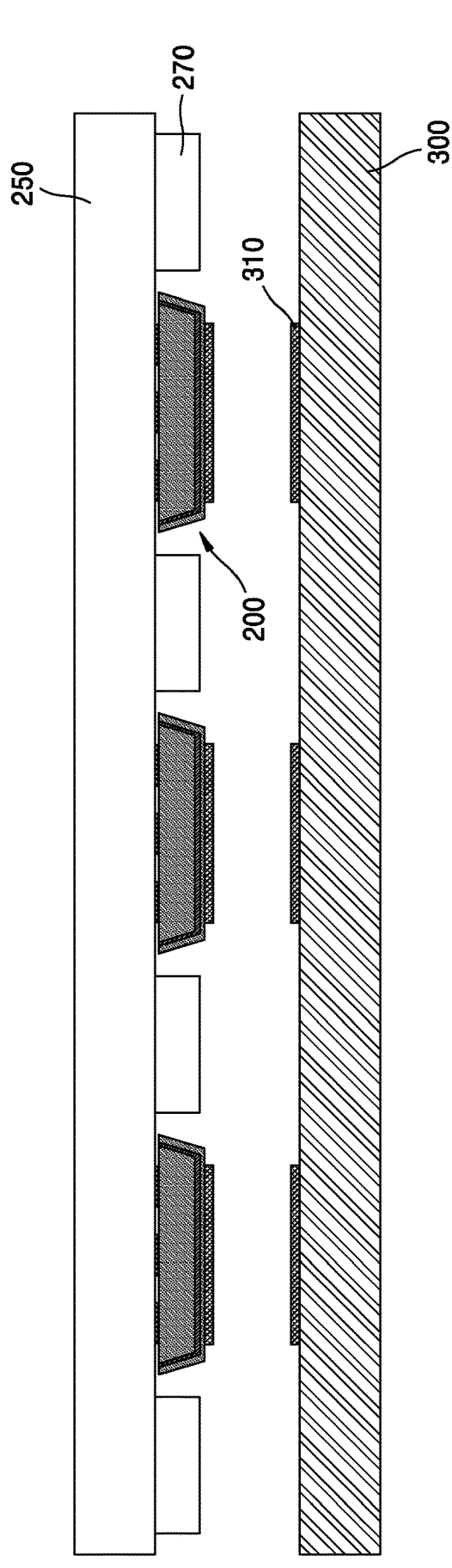

Referring to FIG. 11B, the LED device 200 may be transferred to a target substrate 300 after the transfer substrate 250 on which the LED device 200 is disposed is turned over and aligned with the target substrate 300.

A contact electrode 310 may be disposed on the target substrate 300 to correspond to the arrangement of the LED device 200 of the transfer substrate 250, and when the transfer substrate 250 approaches the target substrate 300, the first electrode 210 of the LED device 200 may be in contact with the contact electrode 310.

Figure 11C:
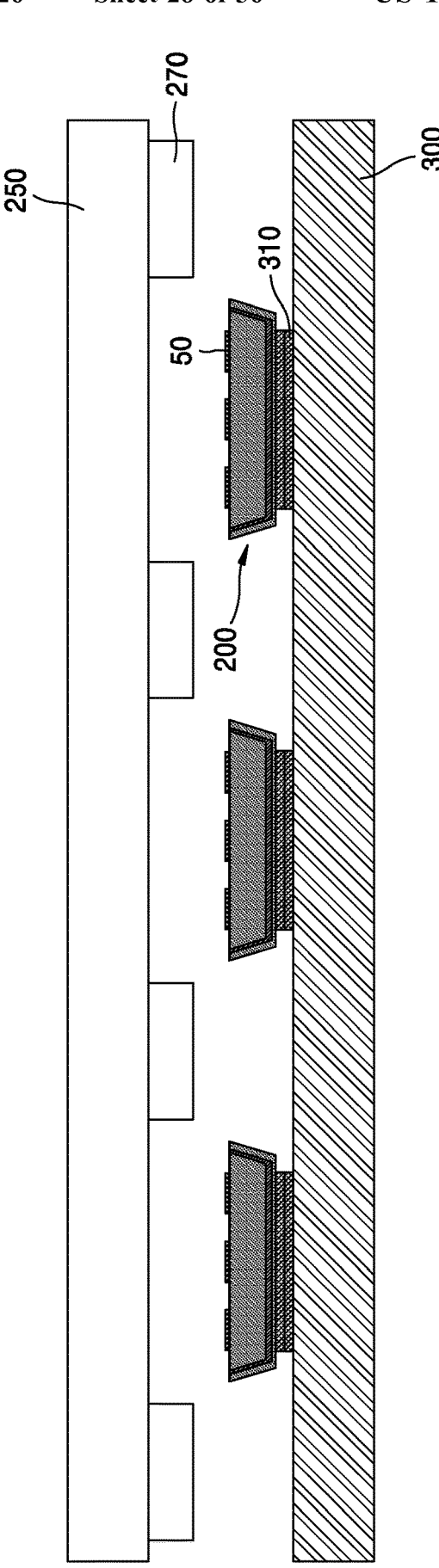

Referring to FIG. 11C, thereafter, by moving the transfer substrate 250 away from the target substrate 300, the LED device 200 may be disposed on the target substrate 300 while the first electrode 210 is in contact with the contact electrode 310. In this case, the first semiconductor layer 201 of the LED device 200 may be located on the upper portion.

Figure 11D:
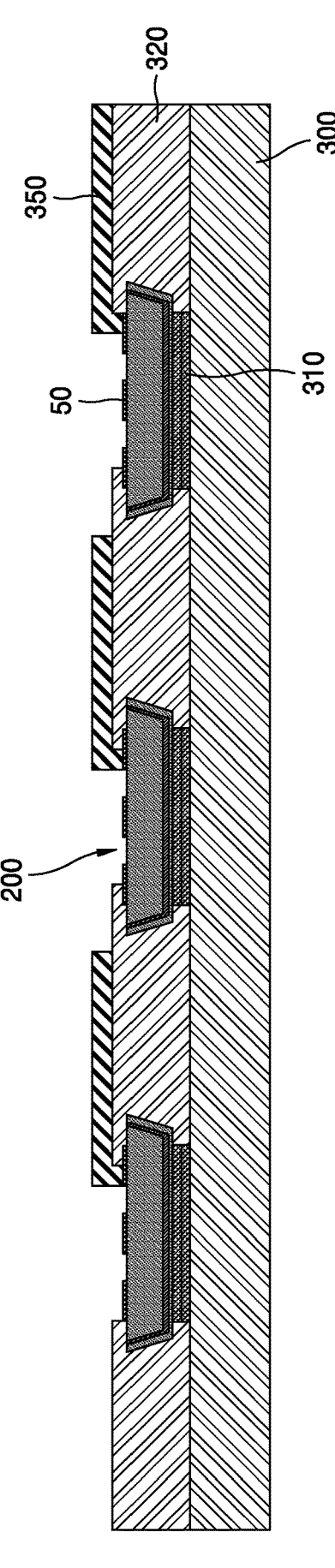

Referring to FIG. 11D, an array of the LED devices 200 may be formed by forming an insulating layer 320 to insulate between adjacent LED devices 200, and forming a second electrode 350 to be electrically connected to the first semiconductor layer 201 of the LED device 200. As shown in FIGS. 11A to 11E, when the 2D material pattern 50 is on the surface of the first semiconductor layer 201, the 2D material pattern 50 may be used as an electrode, and the second electrode 350 may be formed in electrical contact with the 2D material pattern 50.

Figure 11E:
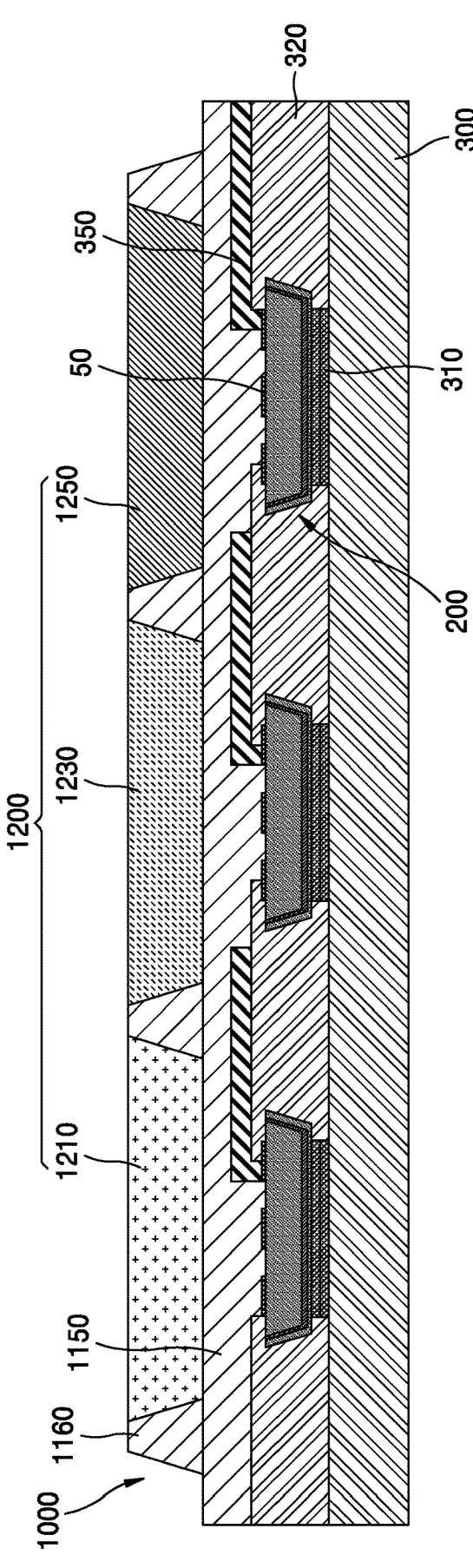

Referring to FIG. 11E, a color conversion layer 1200 may be formed on the array of the LED devices 200. The color conversion layer 1200 may be provided between a partition 1160 and a partition 1160. The LED device 200 may emit a first color light, for example, blue light. In this case, the color conversion layer 1200 may include, for example, a first color conversion layer 1210 that converts or transmits light emitted from the LED device into first color light, a second color conversion layer 1230 that converts the light into second color light, and a third conversion layer 1250 that converts the light into third color light. The first color light may be, for example, blue light, the second color light may be, for example, green light, and the third color light may be, for example, red light.

When the LED device 200 emits the blue light, the first color conversion layer 1210 may be provided to improve the purity of the blue light. For example, the first color conversion layer 1210 may be provided to convert blue light emitted from the LED device 200 into the blue light having high purity. The first color conversion layer 1210 may include quantum dots (QDs) that are excited by the blue light and emit the blue light having high purity, or may include a phosphor. Instead of the first color conversion layer 1210, a transparent resin that transmits the blue light may be used to form a transparent region.

The second color conversion layer 1230 may be provided to convert the blue light emitted from the LED device 200 into green light. The second color conversion layer 1230 may include QDs that are excited by the blue light and emit the green light.

The second color conversion layer 1230 may include the phosphor that is excited by the blue light emitted from the LED device 200 and emits the green light.

The third color conversion layer 1250 may be provided to convert the blue light emitted from the LED device 200 into red light. The third color conversion layer 1250 may include QDs of a certain size that are excited by the blue light to emit the red light, or the phosphor that is excited by the blue light emitted from the LED device 200 and emits the red light.

In the color conversion layer 1200, the QDs may have a core-shell structure having a core portion and a shell portion, or may have a particle structure without a shell. The core-shell structure may be a single-shell or multi-shell structure, such as a double-shell structure. The QDs may include II-VI group series semiconductors, III-V group series semiconductors, IV-VI group series semiconductors, IV group series semiconductors, and/or graphene QDs. The QDs may include, for example, cadmium (Cd), selenium (Se), zinc (Zn), sulphur (S) and/or indium phosphide (InP), and each QD may have a diameter equal to or less than several tens of nm, for example, a diameter equal to or less than about 10 nm.

Through the manufacturing process of FIGS. 11A to 11E, the self-luminescence micro LED display device 1000 may be manufactured.

The self-luminescence micro LED display device 1000 according to the embodiment includes a pixel array in which unit pixels including three or more pixels emitting light of different colors are arranged in a 2D array. Each pixel includes, for example, one LED device 200 and the first, second, or third color conversion layer 1210, 1230, or 1250. In embodiments, the LED device 200 may have a structure including a first surface (for example corresponding to the separation surface 201a) and a second surface having a smaller area than that of the first surface on the opposite side, and includes a plurality of first regions (for example the R1 regions in FIG. 10) and second regions (for example the R2 regions in FIG. 10) of different defect densities on the first surface. The light emission layer may include a first semiconductor layer including the first surface, an active layer on the first semiconductor layer, and a second semiconductor layer on the active layer. An electrode (for example the first electrode 210 in FIGS. 7 to 9) may be provided on the second surface. The LED device 200 may further include the 2D material pattern 50 on the first surface.

The example of implementing the self-luminescence micro LED display device 1000 using the LED device manufactured by applying the method of manufacturing the semiconductor device according to the embodiment has been described and illustrated above, but the embodiment is not limited thereto, and various semiconductor devices may be implemented by applying the manufacturing method according to the embodiment.

Figure 12:
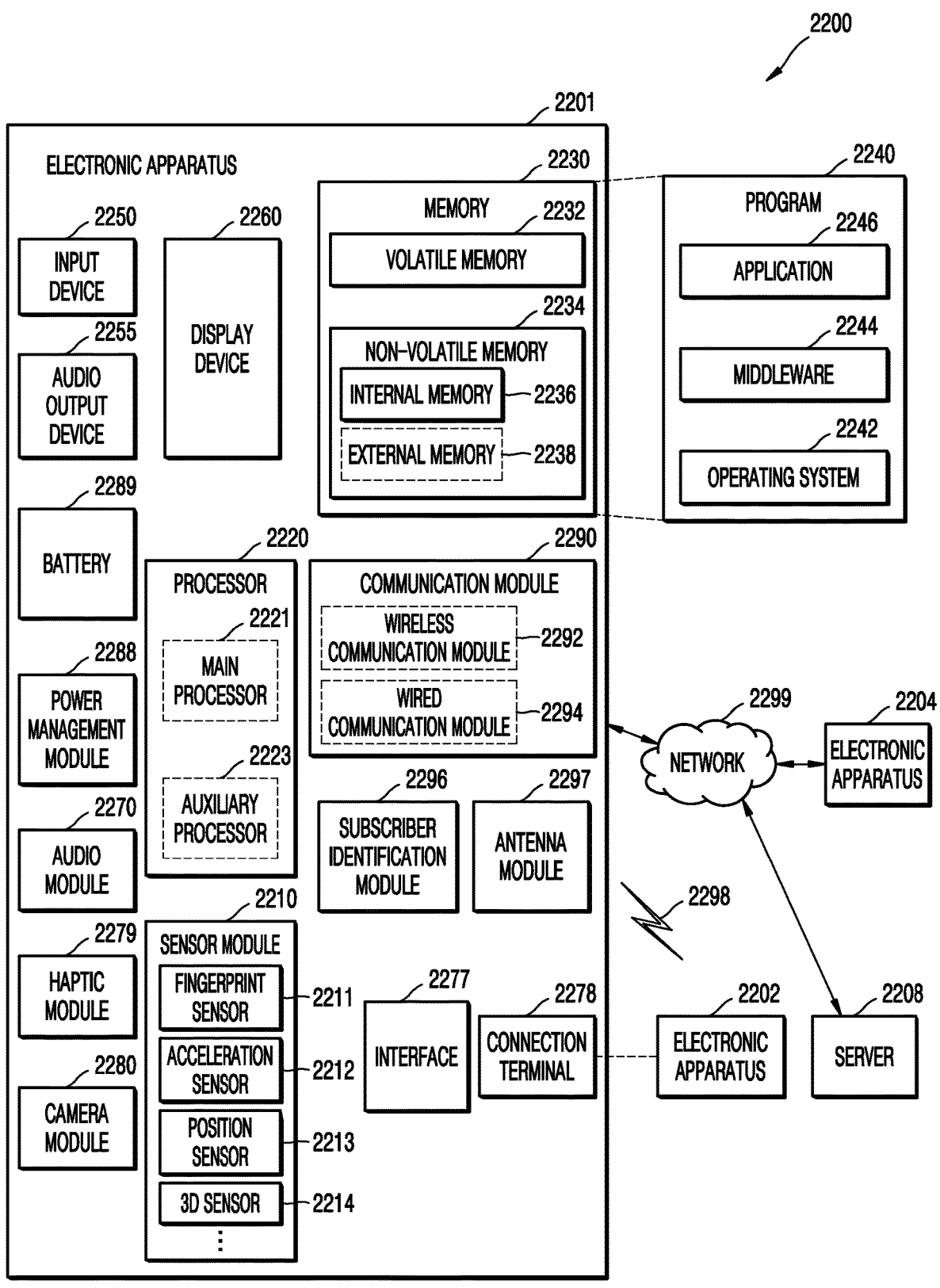
FIG. 12 is a block diagram illustrating a schematic configuration of an electronic apparatus including a display device according to an embodiment.

FIG. 12 is a block diagram illustrating a schematic configuration of an electronic apparatus 2201 including a display device 2260 according to an embodiment.

Referring to FIG. 12, in a network environment 2200, the electronic apparatus 2201 may communicate with another electronic apparatus 2202 over a first network 2298 (for example a short-range wireless communication network, etc.) or may communicate with another electronic apparatus 2204 and/or a server 2208 over a second network 2299 (for example a long-range wireless communication network, etc.) The electronic apparatus 2201 may communicate with the electronic apparatus 2204 through the server 2208. The electronic apparatus 2201 may include a processor 2220, a memory 2230, an input device 2250, an audio output device 2255, the display device 2260, an audio module 2270, a sensor module 2210, an interface 2277, a haptic module 2279, a camera module 2280, a power management module 2288, a battery 2289, a communication module 2290, a subscriber identification module 2296, and/or an antenna module 2297. Some of these components may be omitted from the electronic apparatus 2201, or other components may be added to the electronic apparatus 2201. Some of these components may be implemented as one integrated circuit. For example, a fingerprint sensor 2211, an iris sensor, an illuminance sensor, etc. of the sensor module 2210 may be implemented by being embedded in the display device 2260. In addition, each of the camera module 2280, the haptic module 2279, and the sensor module 2210 may include a part of a processor 2220 and the memory 2230.

The processor 2220 may execute software (for example a program 2240, etc.) to control one or a plurality of other components (hardware, software components, etc.) of the electronic apparatus 2201 (for example hardware, software components, etc.) connected to the processor 2220, and, perform various data processing or operations. As part of data processing or computations, the processor 2220 may load commands and/or data received from other components (for example the sensor module 2210, the communication module 2290, etc.) into a volatile memory 2232, process the commands and/or data stored in the non-volatile memory 2234, and store resulting data in a non-volatile memory 2234. The processor 2220 may include a main processor 2221 (for example a central processing unit, an application processor, etc.) and an auxiliary processor 2223 (for example a graphic processing unit, an image signal processor, a sensor hub processor, a communication processor, etc.) that may be operable independently of or together with the main processor 2221. The auxiliary processor 2223 may use less power than the main processor 2221 and may perform a specialized function.

The auxiliary processor 2223 may control functions and/ or statuses related with some) of the components of the electronic apparatus 2201, for example the display device 2260, the sensor module 2210, the communication module 2290, etc., in place of the main processor 2221 while the main processor 2221 is in an inactive state (for example a sleep state), or in conjunction with the main processor 2221 while the main processor 2221 is in an active state (for example an application execution state). The auxiliary processor 2223 (for example the image signal processor, the communication processor, etc.) may be implemented as a part of other functionally related components (for example the camera module 2280, the communication module 2290, etc.)

The memory 2230 may store various data required by components (for example the processor 2220, the sensor module 2276, etc.) of the electronic apparatus 2201. The data may include, for example, software (for example the program 2240, etc.), and input data and/or output data for instructions related to software. The memory 2230 may include the volatile memory 2232 and/or the non-volatile memory 2234.

The program 2240 may be stored as software in the memory 2230, and may include an operating system 2242, middleware 2244, and/or an application 2246.

The input device 2250 may receive commands and/or data to be used by a component (the processor 2220, etc.) of the electronic apparatus 2201 from the outside (for example from a user, etc.) of the electronic apparatus 2201. The input device 2250 may include a microphone, a mouse, a keyboard, and/or a digital pen (for example a stylus pen, etc.)

The audio output device 2255 may output an audio signal to the outside of the electronic apparatus 2201. The audio output device 2255 may include a speaker and/or a receiver. The speaker may be used for general purposes such as multimedia playback or recording playback, and the receiver may be used to receive incoming calls. The receiver may be incorporated as a part of the speaker or may be implemented as an independent separate device.

The display device 2260 may visually provide information to the outside of the electronic apparatus 2201. The display device 2260 may include the self-luminescence micro LED display device 1000 to which the LED device 200 manufactured by applying the method of manufacturing the semiconductor device described with reference to FIGS. 1 to 11E is applied as a display. The display device 2260 may include a display, a hologram device, or a projector and a control circuit for controlling a corresponding device. The display device 2260 may include a touch circuitry configured to sense a touch, and/or a sensor circuitry (for example a pressure sensor, etc.) configured to measure the intensity of force generated by the touch.

The audio module 2270 may convert sound into an electric signal or, conversely, convert an electric signal into sound. The audio module 2270 may obtain sound through the input device 2250 or may output sound through the audio output device 2255 and/or a speaker and/or a headphone of another electronic apparatus (for example the electronic apparatus 2102, etc.) directly or wirelessly connected to the electronic apparatus 2201.

The sensor module 2210 may sense an operating state (for example power, temperature, etc.) of the electronic apparatus 2201 or an external environmental state (for example a user state, etc.), and generate an electrical signal and/or a data value corresponding to the sensed state. The sensor module 2210 may include the fingerprint sensor 2211, an acceleration sensor 2212, a position sensor 2213, a 3D sensor 2214, etc., and may further include an iris sensor, a gyro sensor, a barometric pressure sensor, a magnetic sensor, a grip sensor, a proximity sensor, a color sensor, an infrared (IR) sensor, a biometric sensor, a temperature sensor, a humidity sensor, and/or an illuminance sensor.

The 3D sensor 2214 may irradiate a certain light to an object and analyze the light reflected from the object to sense a shape and movement of the object. For example, an imaging optical system and an imaging device including the same may be applied to the 3D sensor 2214.

The interface 2277 may support one or more specified protocols that may be used by the electronic apparatus 2201 to directly or wirelessly connect with another electronic apparatus (for example the electronic apparatus 2102, etc.) The interface 2277 may include a high definition multimedia interface (HDMI), a universal serial bus (USB) interface, an SD card interface, and/or an audio interface.

The connection terminal 2278 may include a connector through which the electronic apparatus 2201 may be physically connected to another electronic apparatus (for example the electronic apparatus 2102, etc.) The connection terminal 2278 may include an HDMI connector, a USB connector, an SD card connector, and/or an audio connector (a headphone connector, etc.)

The haptic module 2279 may convert an electrical signal into a mechanical stimulus (for example vibration, movement, etc.) or an electrical stimulus that the user may perceive through tactile or kinesthetic sense. The haptic module 2279 may include a motor, a piezoelectric element, and/or an electrical stimulation device.

The camera module 2280 may capture still images and moving images. The camera module 2280 may include an imaging optical system including one or more lenses, image sensors, image signal processors, and/or flashes. The imaging optical system included in the camera module 2280 may collect light emitted from a subject, which is an image capture target.

The power management module 2288 may manage power supplied to the electronic apparatus 2201. The power management module 2288 may be implemented as part of a power management integrated circuit (PMIC).

The battery 2289 may supply power to components of the electronic apparatus 2201. The battery 2289 may include a non-rechargeable primary cell, a rechargeable secondary cell, and/or a fuel cell.

The communication module 2290 may establish a direct (wired) communication channel and/or a wireless communication channel between the electronic apparatus 2201 and another electronic apparatus (for example the electronic apparatus 2102, the electronic apparatus 2104, the server 2108, etc.) and support communication through the established communication channel. The communication module 2290 may include one or more communication processors that operate independently of the processor 2220 (for example an application processor, etc.) and support direct communication and/or wireless communication. The communication module 2290 may include a wireless communication module 2292 (a cellular communication module, a short-range wireless communication module, a global navigation satellite system (GNSS) communication module) and/or a wired communication module 2294 (for example a local area network (LAN) communication module, a power line communication module, etc.) A corresponding communication module among these communication modules may communicate with another electronic apparatus over the first network 2298 (a short-range communication network such as Bluetooth, WiFi Direct, or Infrared Data Association (IrDA)) or the second network 2299 (a long-range wireless communication network such as a cellular network, the Internet, or a computer network (for example LAN, WAN, etc.)) These various types of communication modules may be integrated into one component (for example a single chip, etc.) or implemented as a plurality of components (for example a plurality of chips) separate from each other. The wireless communication module 2292 may identify and authenticate the electronic apparatus 2201 within a communication network, such as the first network 2298 and/or the second network 2299 by using subscriber information (an International Mobile Subscriber Identifier (I MSI)) stored in the subscriber identification module 2296.

The antenna module 2297 may transmit or receive a signal and/or power to or from the outside (for example another electronic apparatus). The antenna may include a radiator configured as a conductive pattern formed on a substrate (for example a PCB, etc.) The antenna module 2297 may include one or a plurality of antennas. When the antenna module 2297 includes the plurality of antennas, an antenna suitable for a communication method used in a communication network such as the first network 2298 and/or the second network 2299 may be selected from among the plurality of antennas by the communication module 2290. The signal and/or power may be transmitted or received between the communication module 2290 and another electronic apparatus through the selected antenna. In addition to the antenna, other components (for example an RFIC, etc.) may be included as a part of the antenna module 2297.

Some of the components may be connected to each other and exchange signals (for example commands, data, etc.) through communication methods (a bus, General Purpose Input and Output (GPIO), Serial Peripheral Interface (SPI), Mobile Industry Processor Interface (MIPI), etc.) between peripheral devices.

The commands or data may be transmitted or received between the electronic apparatus 2201 and the external electronic apparatus 2204 through the server 2108 connected to the second network 2299. The other electronic apparatuses 2202 and 2204 may be the same type as or different types from the electronic apparatus 2201. All or part of the operations executed by the electronic apparatus 2201 may be executed by one or more of the other electronic apparatuses 2202, 2204, and 2208. For example, when the electronic apparatus 2201 needs to perform a function or service, the electronic apparatus 2201 may request one or more other electronic apparatuses to perform part or all of the function or service instead of executing the function or service itself. One or more other electronic apparatuses receiving a request may execute an additional function or service related to the request, and transmit a result of execution to the electronic apparatus 2201. To this end, cloud computing, distributed computing, and/or client-server computing technologies may be used.

Figure 13:
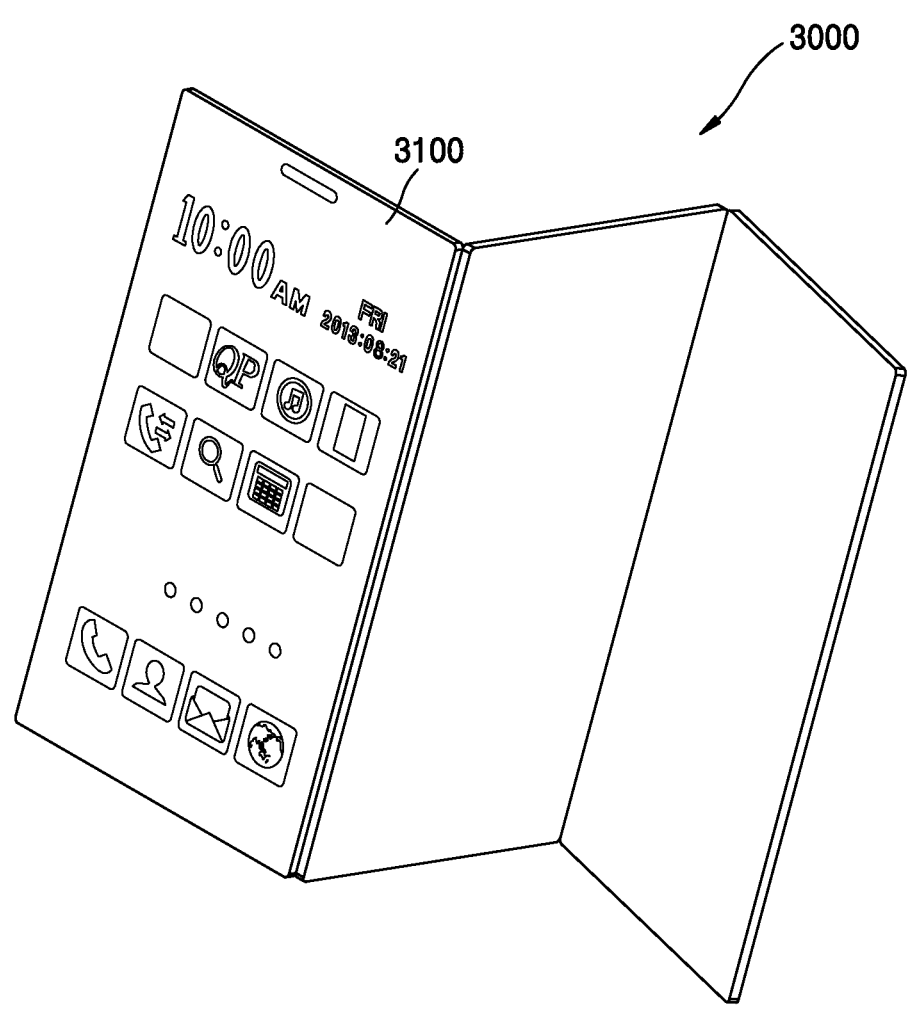
FIG. 13 illustrates an example in which a display device is applied to a mobile device, according to an embodiment.

FIG. 13 illustrates an example in which a display device 3100 according to an embodiment is applied to a mobile device 3000. The mobile device 3000 may include the display device 3100. The display device 3100 may include the self-luminescence micro LED display device 1000 to which the LED device 200 manufactured by applying the method of manufacturing the semiconductor device described with reference to FIGS. 1 to 11E is applied. The display device 3100 may have a foldable structure and, for example, may be implemented as a multi-folder display. The mobile device 3000 is illustrated as having a folder type display, but may also have a flat panel display.

Figure 14:
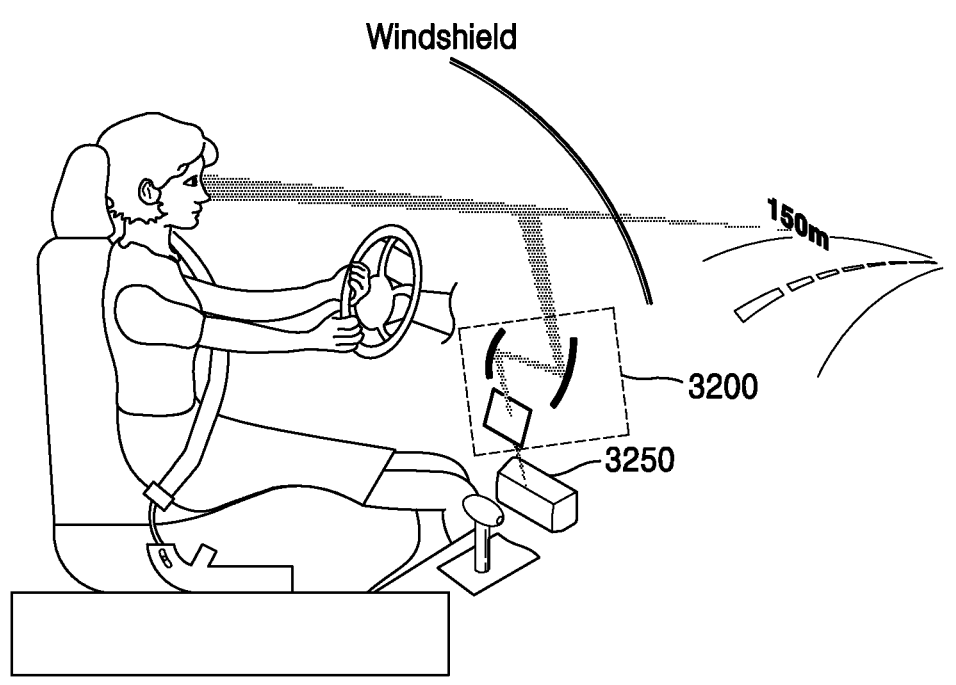
FIG. 14 illustrates an example in which a display device is applied to a vehicle, according to an embodiment.

FIG. 14 shows an example in which a display device 3250 according to an embodiment is applied to a vehicle. The display device 3250 may be implemented as a vehicle head-up display device in the vehicle. The head-up display device may include a display device 3250 provided in a region of the vehicle, and at least one light path changing member 3200 that converts a path of light so that a driver may see an image generated by the display device 3250. The display device 3250 may include the self-luminescence micro LED display device 1000 to which the LED device 200 manufactured by applying the method of manufacturing the semiconductor device described with reference to FIGS. 1 to 11E is applied.

Figure 15:
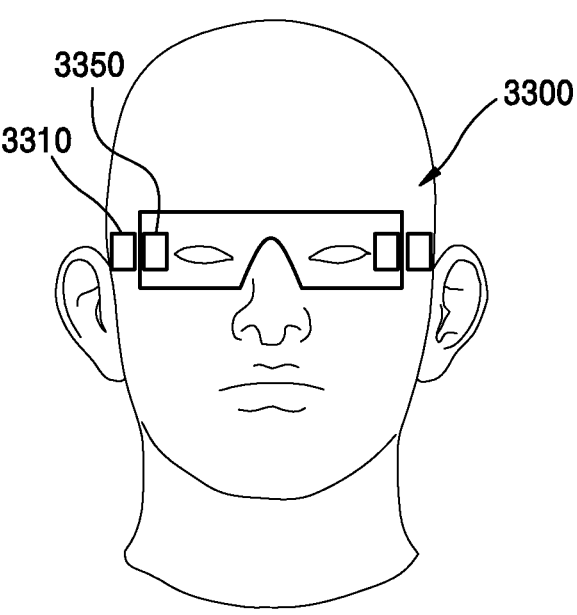
FIG. 15 illustrates an example in which a display device is applied to augmented reality glasses or virtual reality glasses, according to an embodiment.

FIG. 15 illustrates an example in which a display device according to an embodiment is applied to augmented reality glasses 3300 or virtual reality glasses. The augmented reality glasses 3300 may include a projection system 3310 that forms an image, and at least one element 3350 that guides the image from the projection system 3310 into the user's eye. The projection system 3310 may include the self-luminescence micro LED display device 1000 to which the LED device 200 manufactured by applying the method of manufacturing the semiconductor device described with reference to FIGS. 1 to 11E is applied.

Figure 16:
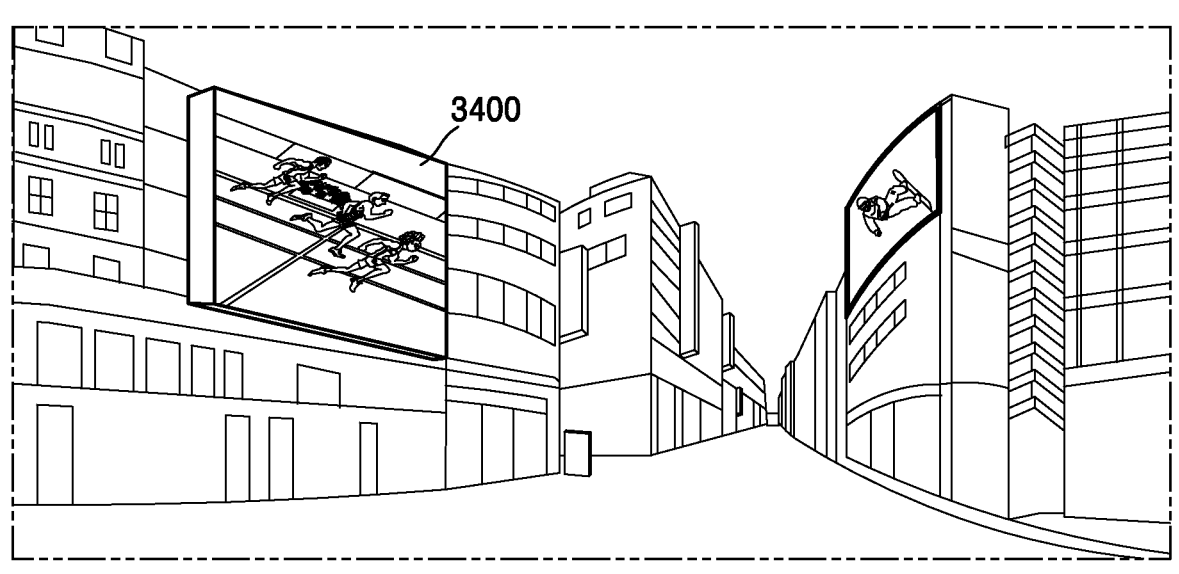
FIG. 16 illustrates an example in which a display device is applied to a large-sized signage, according to an embodiment.

FIG. 16 illustrates an example in which a display device according to an embodiment is applied to a large-sized signage 3400. The signage 3400 may be used for outdoor advertisement using a digital information display, and may control advertisement contents, etc. through a communication network. The signage 3400 may be implemented by, for example, applying the self-luminescence micro LED display device 1000 to which the LED device 200 manufactured by applying the method of manufacturing the semiconductor device described with reference to FIGS. 1 to 11E is applied.

Figure 17:
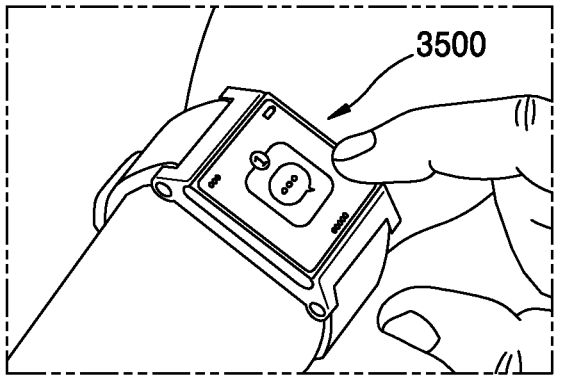
FIG. 17 illustrates an example in which a display device is applied to a display of a wearable device, according to an embodiment.

FIG. 17 illustrates an example in which a display device according to an embodiment is applied to a display 3500 of a wearable device. The display 3500 of the wearable device may be implemented by applying the self-luminescence micro LED display device 1000 to which the LED device 200 manufactured by applying the method of manufacturing the semiconductor device described with reference to FIGS. 1 to 11E is applied.

The display device according to the embodiment may also be applied to various products such as a rollable TV and a stretchable display.

According to the method of manufacturing the semiconductor device according to the embodiment, a pattern for forming a membrane is formed on a substrate, a membrane material layer is formed on the substrate to cover the membrane forming pattern, a membrane having a protruding pattern is formed by crystallizing the membrane material layer, and a 2D material pattern is formed on a protruding pattern of the membrane by growing a 2D material on the membrane, and thus the characteristics of the 2D material during a growth process may be maintained.

In addition, according to the method of manufacturing the semiconductor device according to the embodiment, because the 2D material pattern is formed by directly growing the 2D material on the crystallized membrane structure having the protruding pattern, a physical patterning process of the 2D material is omitted, and thus, the grown 2D material pattern is not damaged.

In addition, because the 2D material pattern formed as above has a weak bonding force, the 2D material pattern may be transferred to a transfer substrate or used as a transfer template for transferring a semiconductor device structure grown on the 2D material pattern in a subsequent process.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a semiconductor device, the method comprising:
   forming a membrane forming pattern on a substrate;
   forming a membrane material layer on the substrate, wherein the membrane material layer covers the membrane forming pattern;
   forming a membrane having a protruding pattern by crystallizing the membrane material layer, wherein a width of the protruding pattern of the membrane is less than or equal to a grain size which is formed when the 2D material is grown;
   forming a two-dimensional (2D) material pattern on the protruding pattern by growing a 2D material on the membrane; and
   transferring the 2D material pattern to a transfer substrate.

2. The method of claim 1, wherein at least one from among a detector, a transistor, a diode, and a photoelectric device is manufactured by repeating the forming of the 2D material pattern and the transferring of the 2D material pattern to the transfer substrate a plurality of times.

3. The method of claim 1, wherein the membrane forming pattern comprises a sacrificial layer pattern, and
   wherein the method further comprises removing the sacrificial layer pattern.

4. The method of claim 1, wherein the 2D material comprises any one of graphene, hexagonal boron nitride (h-BN), and molybdenum disulfide ($MoS_2$).

5. The method of claim 1, wherein the substrate comprises a sapphire substrate, and
   wherein the membrane comprises crystallized alumina.

6. A method of manufacturing a semiconductor device, the method comprising:
   forming a membrane forming pattern on a substrate;
   forming a membrane material layer on the substrate, wherein the membrane material layer covers the membrane forming pattern;
   forming a membrane having a protruding pattern by crystallizing the membrane material layer,
   wherein a width of the protruding pattern of the membrane is less than or equal to a grain size which is formed when the 2D material is grown;
   forming a two-dimensional (2D) material pattern on the protruding pattern by growing a 2D material on the membrane;
   growing a semiconductor material on the 2D material pattern and forming a semiconductor device structure; and
   separating the semiconductor device structure from the substrate.

7. The method of claim 6, wherein the separating comprises separating the semiconductor device structure from the 2D material pattern.

8. The method of claim 6, wherein the separating comprises separating the 2D material pattern from the protruding pattern such that the semiconductor device structure and the 2D material pattern are separated from the substrate.

9. The method of claim 6, wherein leg parts of the membrane collapse during the separating such that the semiconductor device structure is separated from the substrate.

10. The method of claim 6, further comprising: transferring the separated semiconductor device structure onto a transfer substrate.

11. The method of claim 10, wherein the transferring comprises transferring the semiconductor device structure onto the transfer substrate by a fluid self-assembly method.

12. The method of claim 6, wherein the semiconductor device structure comprises a light emitting diode (LED) device.

13. The method of claim 6, wherein the membrane forming pattern comprises a sacrificial layer pattern, and
   wherein the method further comprises removing the sacrificial layer pattern.

14. The method of claim 6, wherein the 2D material comprises any one of graphene, hexagonal boron nitride (h-BN), and molybdenum disulfide (MoS2).

15. The method of claim 6, wherein the substrate comprises a sapphire substrate, and
   wherein the membrane comprises crystallized alumina.

* * * * *